US012772745B2

(12) United States Patent
Hong et al.

(10) Patent No.: US 12,772,745 B2
(45) Date of Patent: Oct. 20, 2026

(54) SPIN LOGIC DEVICE HAVING ENHANCED DATA RETENTION

(71) Applicant: INDUSTRY-ACADEMIC COOP. FOUND., YONSEI UNIV., Seoul (KR)

(72) Inventors: Jongill Hong, Seoul (KR); Min Hyuk Park, Seoul (KR); Taehui Na, Incheon (KR)

(73) Assignee: INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 441 days.

(21) Appl. No.: 18/515,504

(22) Filed: Nov. 21, 2023

(65) Prior Publication Data

US 2024/0349618 A1 Oct. 17, 2024

(30) Foreign Application Priority Data

Apr. 17, 2023 (KR) ........................ 10-2023-0050282

(51) Int. Cl.
*H10N 50/20* (2023.01)
*H10N 50/80* (2023.01)
*H10N 50/85* (2023.01)

(52) U.S. Cl.
CPC ............. *H10N 50/20* (2023.02); *H10N 50/80* (2023.02); *H10N 50/85* (2023.02)

(58) Field of Classification Search
CPC ......... H10N 50/20; H10N 50/80; H10N 50/85
See application file for complete search history.

(56) References Cited

U.S. PATENT DOCUMENTS

| | | | | |
|---|---|---|---|---|
| 11,502,188 | B2 | 11/2022 | Lin et al. | |
| 11,729,992 | B2 | 8/2023 | Jeon et al. | |
| 2016/0133827 | A1* | 5/2016 | Lew | G11C 11/14 326/47 |
| 2019/0386662 | A1* | 12/2019 | Lin | H01F 10/3213 |
| 2020/0365652 | A1* | 11/2020 | Hong | H03K 19/17728 |
| 2022/0352187 | A1 | 11/2022 | Jeon et al. | |
| 2024/0170059 | A1* | 5/2024 | Hsiang | G11C 11/221 |

FOREIGN PATENT DOCUMENTS

| | | |
|---|---|---|
| KR | 10-2020-0135149 A | 12/2020 |
| KR | 10-2022-0148640 A | 11/2022 |

OTHER PUBLICATIONS

Manipatruni et al.; "Scalable energy-efficient magnetoelectric spin-orbit logic," Nature, vol. 565, Jan. 3, 2019, pp. 35-43.

* cited by examiner

*Primary Examiner* — Benjamin Tzu-Hung Liu
(74) *Attorney, Agent, or Firm* — Central California IP Group, P.C.; Andrew D. Fortney

(57) ABSTRACT

A spin logic device includes: a first conductive layer formed of a nonmagnetic conductive material and having one end receiving first current as an input; a ferromagnetic layer having magnetic anisotropy and having one end opposing the other end of the first conductive layer; and an antiferroelectric layer disposed between the other end of the first conductive layer and the one end of the ferromagnetic layer. A magnetization direction of the ferromagnetic layer may be determined based on a current direction of the first current of the first conductive layer.

13 Claims, 23 Drawing Sheets

100

SPIN LOGIC DEVICE HAVING ENHANCED DATA RETENTION

CROSS-REFERENCE TO RELATED APPLICATIONS

This U.S. non-provisional patent application claims priority under 35 U.S.C. § 119 to Korean Patent Application No. 10-2023-0050282, filed on Apr. 17, 2023, in the Korean Intellectual Property Office, the entire contents of which are hereby incorporated by reference.

TECHNICAL FIELD

The present disclosure relates to a spin logic device, and more particularly, to a spin logic device, based on spin-charge conversion, including an antiferroelectric layer.

BACKGROUND

Spintronics refers to technology for controlling electrons using a direction of spin or a magnetization direction of the electrons.

In this regard, recently, there has been an increasing interest in spintronic devices as next-generation semiconductor devices.

As compared to conventional devices, spintronic devices have drawn a significant attention because of characteristics of nonvolatile data, high operation speed and large storage capacity.

Spin polarization current is generated when current flows to a ferromagnetic material, so that spin logic devices using such a ferromagnetic material may be taken into count.

In this regard, by devising a spin logic device which is capable of switching a magnetization direction of a ferromagnetic material using current (or voltage) depending on both the magnetization direction of the ferromagnetic material and a spin-charge conversion, a method of allowing such a spin logic device to be utilized in next-generation semiconductor technology may be taken into account.

A magnetoelectric spin-orbit (MESO) device, which was theoretically proposed by Intel Corporation in 2019, is expected to be implemented as a low-power spin logic device having improved performance, compared with CMOS-based devices (Nature 565, 35 (2019)).

SUMMARY

An aspect of the present disclosure is to provide a spin logic device having enhanced data retention in a standby mode in which a voltage is not applied to opposite ends of a dielectric layer.

A spin logic device according to an example embodiment includes: a first conductive layer formed of a nonmagnetic conductive material and having one end receiving first current as an input; a ferromagnetic layer having magnetic anisotropy and having one end opposing the other end of the first conductive layer; and an antiferroelectric layer disposed between the other end of the first conductive layer and the one end of the ferromagnetic layer. A magnetization direction of the ferromagnetic layer may be determined based on a current direction of the first current of the first conductive layer.

In an example embodiment, the spin logic device may include: a second conductive layer formed of a nonmagnetic conductive material and disposed to be spaced apart from the first conductive layer and to be vertically spaced apart from the other end of the ferromagnetic layer; a spin-to-charge conversion layer disposed between the other end of the ferromagnetic layer and one end of the second conductive layer; a lower auxiliary electrode electrically connected to ground or a negative voltage and disposed below one end of the second conductive layer; and an upper auxiliary electrode disposed above the other end of the ferromagnetic layer. The upper auxiliary electrode may be connected to a supply voltage, and a direction of second current, flowing in the other end of the second conductive layer, may be determined based on a magnetization direction of the ferromagnetic layer.

In an example embodiment, the antiferroelectric layer may include $Hf_xZr_{1-x}O_2$, where x ranges from 0.1 to 0.4.

In an example embodiment, x may range from 0.12 to 0.32.

In an example embodiment, the antiferroelectric layer may have a thickness of 3 nm to 29 nm.

In an example embodiment, the antiferroelectric layer may have a single peak in each of first, second, third, and fourth quadrants, in a voltage-dependent current hysteresis loop, or the antiferroelectric layer may have two peaks in the first quadrant and two peaks in the third quadrant, in the voltage-dependent current hysteresis loop.

In an example embodiment, the antiferroelectric layer may have a first peak disposed in a first quadrant and a second peak disposed in the first quadrant and a second quadrant in a voltage-dependent current hysteresis loop, and the antiferroelectric layer may have a third peak disposed in a third quadrant and a fourth peak disposed at a boundary between the third quadrant and the fourth quadrant, in the voltage-dependent current hysteresis loop.

In an example embodiment, a slope of coercive force of the ferromagnetic layer to a potential difference of a potential of the ferromagnetic layer to a potential of the first conductive layer may be −363 Oe/V or more.

In an example embodiment, the one end of the first conductive layer may include a plurality of branched input terminals, and input currents may be provided through the input terminals, respectively.

In an example embodiment, the other end of the second conductive layer may include a plurality of branched output terminals, and output currents may be provided through the output terminals, respectively.

In an example embodiment, the spin logic device may include a first spin logic device and a second spin logic device, and the second conductive layer of the first spin logic device may be the first conductive layer of the second spin logic device.

A spin logic device according to an example embodiment includes: a first conductive layer formed of a nonmagnetic conductive material and having one end receiving first current as an input; a ferromagnetic layer having magnetic anisotropy and having one end opposing the other end of the first conductive layer; and an antiferroelectric layer disposed between the other end of the first conductive layer and the one end of the ferromagnetic layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
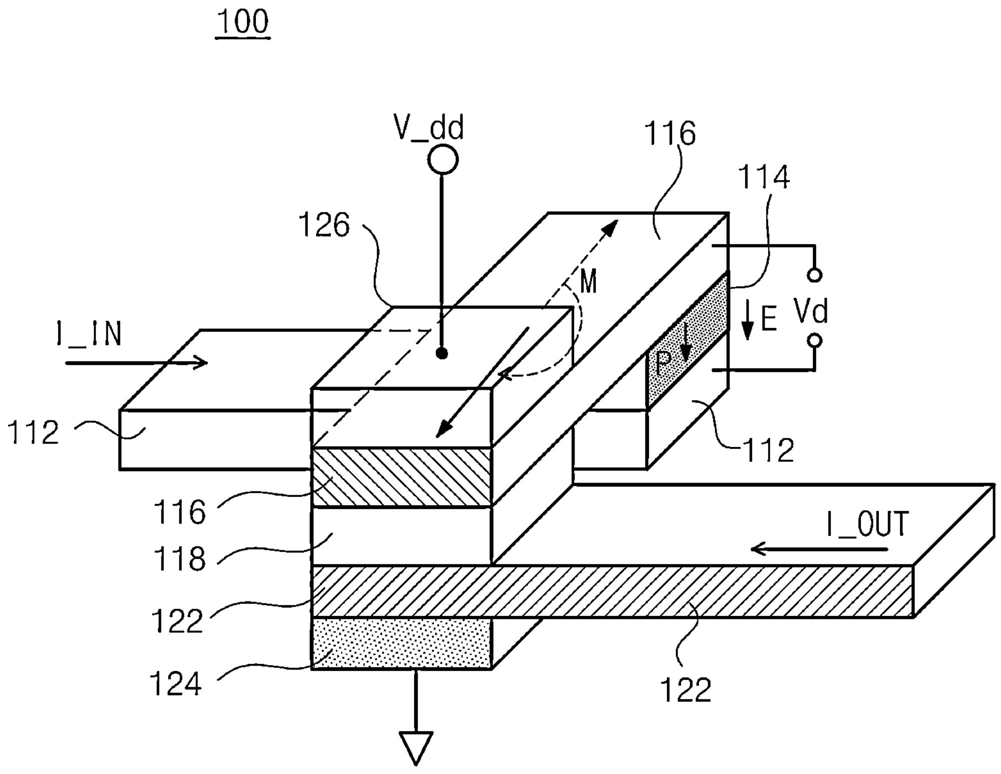
FIG. 1 is a conceptual diagram illustrating a spin logic device according to an example embodiment of the present disclosure.

In a spin logic device having a stack structure in which a conductive layer, a dielectric layer, and a ferromagnetic layer are sequentially stacked, the dielectric layer may be a high-κ dielectric material or a ferroelectric material having a high dielectric constant. Even when an applied electric field is removed from a ferroelectric material, remanent electric polarization may be present, so that magnetization reversal may easily unintentionally occur in the ferromagnetic layer adjacent to the ferroelectric material due to the remanent electric polarizations and to external noise current resulting in loss in data or in a weak retention of data.

According to an example embodiment, a spin logic device using an antiferroelectric material as a dielectric layer may retain data and reduce interference from the remnant electric polarization and a neighboring cell, as compared with a spin logic device using a ferroelectric material.

In the case of a spin logic device using a ferroelectric material as a dielectric layer, remanent polarization may be present when an electric field applied to the dielectric layer is removed, so that a magnetic anisotropy energy of the ferromagnetic material be stayed as it is reduced. Accordingly, a spin direction (or a magnetization direction) of the ferromagnetic material may be unintentionally changed due to not only remanent polarization but mutual interference from a neighboring cell or device or thermal instability. As a result, an error or a loss in data is likely to occur in the spin logic device since the data is unlikely to be retained in a desired data state.

On the other hand, in the case of a spin logic device using an antiferroelectric material as a dielectric layer, polarization of the dielectric layer may disappear (or remanent polarization is substantially absent) when an electric field applied to the antiferroelectric layer is removed, so that a change in magnetic anisotropy energy of the ferroelectric material may not be affected. Accordingly, a spin direction (or a magnetization direction) of the ferromagnetic material may be stably maintained against mutual interference from a neighboring cell or device or thermal instability. As a result, occurrence of an error in the spin logic device may be reduced and desired retention of data may be improved.

In a spin logic device having a structure in which a conductive layer, an antiferroelectric layer, and a ferromagnetic layer are sequentially stacked, an effective electric field generated by an interface charge between the antiferroelectric layer and the ferromagnetic layer induced by a pulse voltage, and a write magnetic field induced by current may switch a magnetization direction of a ferroelectric material. In addition, spin current depending on a magnetization direction of the ferromagnetic layer may output charge current through a spin-charge conversion (SCC) quantum effect. Such spin logic devices may be connected in a cascading structure to perform a cascading operation at room temperature.

Charges, induced in an interface between the antiferroelectric layer and the ferromagnetic layer, may act as an effective electric field. The charges, induced in the interface between the antiferroelectric layer and the ferromagnetic layer, may reduce magnetic anisotropy energy of an adjacent ferromagnetic material. Such an effect may be similar to an effect obtained by applying a voltage to an insulating material. Such an effect may be similar to voltage controlled magnetic anisotropy (VCMA). However, such an effect may significantly reduce the magnetic anisotropy energy because high polarization occurs at the interface between the antiferroelectric layer and the ferroelectric layer due to characteristics of the ferroelectric material having a high dielectric constant.

According to an example embodiment, $[Hf_{0.35}Zr_{0.65}]O_2$ exhibiting antiferroelectricity may have a high polarization (electric polarization caused by electric dipole moments) value under a high electric field. However, when the electric field is removed, the polarization may disappear (residual polarization=0) and thus may not affect a change in magnetic anisotropy energy of a ferromagnetic material.

In the case of use of a ferroelectric material, remanent polarization may be present even when an electric field is removed, so that magnetic anisotropy energy of the ferromagnetic material may be maintained while being reduced. Accordingly, a spin direction (or a magnetization direction) of the ferromagnetic material may be unintentionally changed due to mutual interference from neighboring cells, thermal instability, or the like. As a result, an error is likely to occur in data or the data is unlikely to be retained as described data.

Therefore, when an antiferroelectric material is applied to a spin logic device, an error rate of data may be significantly reduced, and desired data may be retained and interference from a neighboring cell may be reduced.

Hereinafter, example embodiments will now be described more fully with reference to the accompanying drawings, in which some example embodiments are shown. Example embodiments may, however, be embodied in many different forms and should not be construed as being limited to the embodiments set forth herein. Rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements.

FIG. 1 is a conceptual diagram illustrating a spin logic device according to an example embodiment of the present disclosure.

Figure 2A:
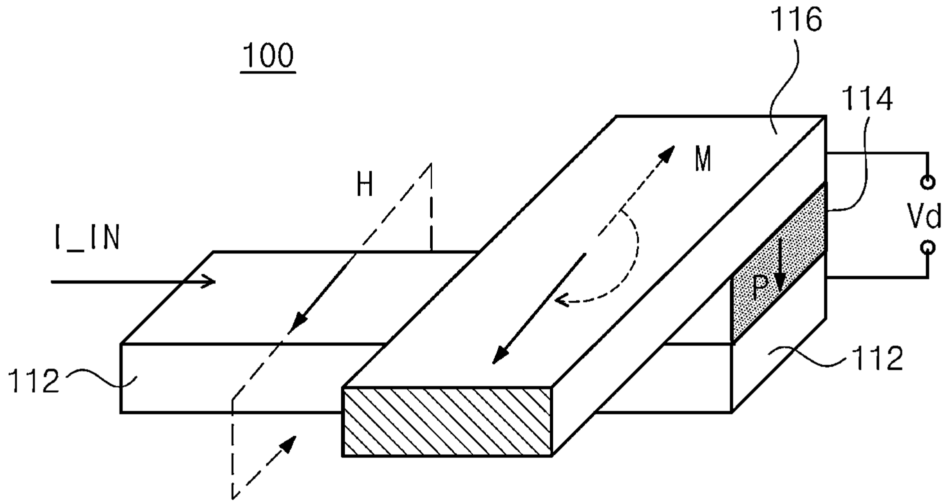
FIG. 2A is a diagram illustrating switching of a magnetization direction of a ferromagnetic layer when current in a first direction flows to a first conductive layer of the spin logic device of FIG. 1.

FIG. 2A is a diagram illustrating switching of a magnetization direction of a ferromagnetic layer when current in a first direction flows to a first conductive layer of the spin logic device of FIG. 1.

Figure 2B:
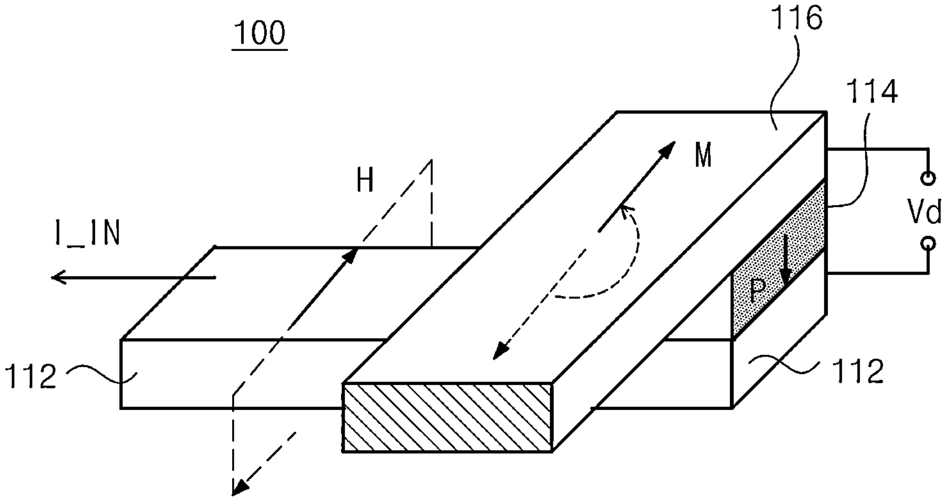
FIG. 2B is a diagram illustrating switching of a magnetization direction of a ferromagnetic layer when current in a second direction flows to the first conductive layer of the spin logic device of FIG. 1.

FIG. 2B is a diagram illustrating switching of a magnetization direction of a ferromagnetic layer when current in a second direction flows to the first conductive layer of the spin logic device of FIG. 1.

Referring to FIGS. 1, 2A and 2B, a spin logic device 100 may include a first conductive layer 112 formed of a nonmagnetic conductive material and having one end receiving first current I_IN as an input, a ferromagnetic layer 116 having magnetic anisotropy and having one end opposing the other end of the first conductive layer 112, and an antiferroelectric layer 114 disposed between the other end of the first conductive layer 112 and the one end of the ferromagnetic layer 116. A magnetization direction of the ferromagnetic layer 116 may be determined based on a current direction of the first current I_IN of the first conductive layer 112.

The second conductive layer 122 may be formed of a nonmagnetic conductive material, and may be disposed to be spaced apart from the first conductive layer 112 and to be vertically spaced apart from the other end of the ferromagnetic layer 116. A spin-to-charge conversion layer 118 may be disposed between the other end of the ferromagnetic layer 116 and one end of the second conductive layer 122.

A lower auxiliary electrode 124 may be electrically connected to ground or a negative voltage, and may be disposed below the one end of the second conductive layer 122. An upper auxiliary electrode 126 may be disposed above the other end of the ferromagnetic layer 116. A supply voltage V_dd may operate in a pulse form, and may be connected to the upper auxiliary electrode 126. A direction of second current I_OUT, flowing in the other end of the second conductive layer 122, may be determined based on the magnetization direction of the ferromagnetic layer 116.

The spin logic device 100 may receive the first current I_IN through the one end of the first conductive layer 112 to switch the magnetization direction of the ferromagnetic layer 116 with the help of the antiferroelectric layer 114. Spin current, depending on the magnetization direction of the ferromagnetic layer 116, may be converted into charge current by the spin-to-charge conversion layer 118 and may control a direction of the second current I_OUT of the second conductive layer 122.

The spin logic device 100 may be formed on a semiconductor substrate such as silicon.

The first conductive layer 112 may be disposed on the semiconductor substrate, and may be a line pattern formed of a nonmagnetic metal material. The material of the first conductive layer 112 may be molybdenum (Mo), titanium (Ti), aluminum (Al), copper (Cu), and a nonmagnetic metal or a metal alloy. The material of the first conductive layer 112 may also be a titanium nitride (TiN), a tungsten nitride (WN), or tantalum nitride (TaN). The bonding layer may affect dielectric characteristics of the antiferroelectric layer 114. The first conductive layer 112 may be connected to a CMOS logic circuit or a spin logic device to receive current or a voltage.

The antiferroelectric layer 114 may accumulate charges induced according to the first current (or charge current) of the first conductive layer 112, and the accumulated charges may generate an electric field. The antiferroelectric layer 114 may reduce magnetic anisotropy energy of the ferromagnetic layer 116 to reduce threshold energy for magnetization reversal. The antiferroelectric layer 114 may include $Hf_xZr_{1-x}O_2$, where x may be 0.1 to 0.4. The antiferroelectric layer 114 may include $Hf_xZr_{1-x}O_2$, where x may be 0.12 to 0.32. The antiferroelectric layer 114 may have a thickness of 3 nm to 29 nm. The antiferroelectric layer 114 may have a single peak in each of first, second, third, and quadrants in a I-V hysteresis loop of voltage-dependent current. Alternatively, the antiferroelectric layer 114 may have two peaks in the first quadrant and two peaks in the third quadrant in the I-V hysteresis loop of voltage-dependent current.

When the antiferroelectric layer 114 is ideal and an applied electric field is zero, polarization may be zero. However, when the antiferroelectric layer 114 includes $Hf_xZr_{1-x}O_2$ and x is 0.1 to 0.4, the antiferroelectric layer 114 may have antiferroelectric properties or properties in which ferroelectric properties and antiferroelectric properties are mixed. The antiferroelectric properties or the mixed properties, in which ferroelectric properties and antiferroelectric properties are mixed, may be identified because a kink appears in a P-V hysteresis loop of voltage-dependent polarization.

In the case of a ferroelectric material, in a current-field curve, a first peak appears in the first quadrant and a second peak appears in the third quadrant.

In the case of an ideal antiferroelectric, a current-field curve has a single peak in each of first, second, third, and fourth quadrants. A first peak in the first quadrant is positioned in a higher electric field than a second peak in the second quadrant. A third peak in the third quadrant is positioned in a higher electric field (a negative value having a greater absolute value) than a peak in the fourth quadrant.

In the case of a boundary between a ferroelectric layer and an antiferroelectric layer (a morphotropic phase boundary) (mixed properties in which ferroelectric properties and antiferroelectric properties are mixed), two peaks are present in the first quadrant. Also, two peaks are present in the third quadrant. For example, a single peak appears over the vicinity of 0 volt in positive-negative sweep.

In this case in which three peaks appear, a sample is not ideal. Therefore, this case is determined to be a nonideal case in which a location, in which a peak appears, is slightly changed by charge trap, or the like, while being switched. In addition, there is a form in which a peak is cut at an end portion of measurement. Such inevitable phenomena occur during the measurement when a switching peak spans 0 V. The measurement starts at 0 V and ends at 0 V. Accordingly, in this case, the number of peaks is determined to be two, rather than three.

The ferromagnetic layer 116 may be formed of a single ferromagnetic material or artificial antiferromagnetic material. The ferromagnetic layer may have magnetic anisotropy and have two different magnetization directions. The artificial antiferromagnetic material may be a spin valve including two ferromagnetic materials, having different magnetization directions, and a nonmagnetic material disposed between the ferromagnetic materials. The ferromagnetic layer 116 may include at least one of cobalt (Co), nickel (Ni), and iron (Fe).

The spin-to-charge conversion layer 118 may convert spin current into charge current. The spin-to-charge conversion layer 118 may convert spin current into charge current using an inverse spin-Hall effect (or an inverse Rashba-Edelstein effect). The spin-to-charge conversion layer 118 may include bismuth (Bi), silver (Ag), tungsten (W), or tantalum (Ta), a topological insulator, or the like. The spin-to-charge conversion layer 118 may be aligned at an intersection between the ferromagnetic layer 116 and the second conductive layer 122.

A spin injection layer (not illustrated) may be disposed between the spin-charge conversion layer 118 and the ferromagnetic layer 116. The spin injection layer may be a tunnel insulating layer such as magnesium oxide (MgO).

The second conductive layer 122 may be a nonmagnetic metal and may be a line pattern. A material of the second conductive layer 122 may include Mo, Ti, Al, Cu, or a nonmagnetic metal, or may be a metal alloy. The material of the second conductive layer 112 may also be a titanium nitride (TiN), a tungsten nitride (WN), or tantalum nitride (TaN). One end of the second conductive layer 122 may be connected to the spin-charge conversion layer 118, and the other end of the second conductive layer 122 may be connected to a CMOS logic circuit or a spin logic device.

The upper auxiliary electrode 126 may include a nonmagnetic metal such as ruthenium (Ru), titanium (Ti), tantalum (Ta), palladium (Pd), aluminum (Al), or copper (Cu).

The lower auxiliary electrode 124 may include a nonmagnetic metal such as Ru, Ti, Ta, Pd, Al, or Cu.

The auxiliary upper electrode 126 may be connected to a supply voltage V_dd to receive a bias voltage in the form of a pulse, and the auxiliary lower electrode 124 may be connected to ground or a negative voltage.

Referring to FIG. 2A, when the first current I_IN is applied in a positive direction of the first conductive layer 112 and a positive bias voltage is applied, the magnetization direction of the ferromagnetic layer 116 may be switched to a direction of a magnetic field H generated by the current I_IN. The second current I_OUT of the second conductive layer may flow from the other end of the second conductive layer to one end thereof.

Referring to FIG. 2B, when the first current I_IN is applied to the first conductive layer 112 in a negative direction and a positive bias voltage is applied, the magnetization direction of the ferromagnetic layer 116 may be switched to a direction of a magnetic field H generated by the current I_IN. The second current I_OUT of the second conductive layer 122 may flow from one end of the second conductive layer 122 to the other end thereof.

Figure 3:
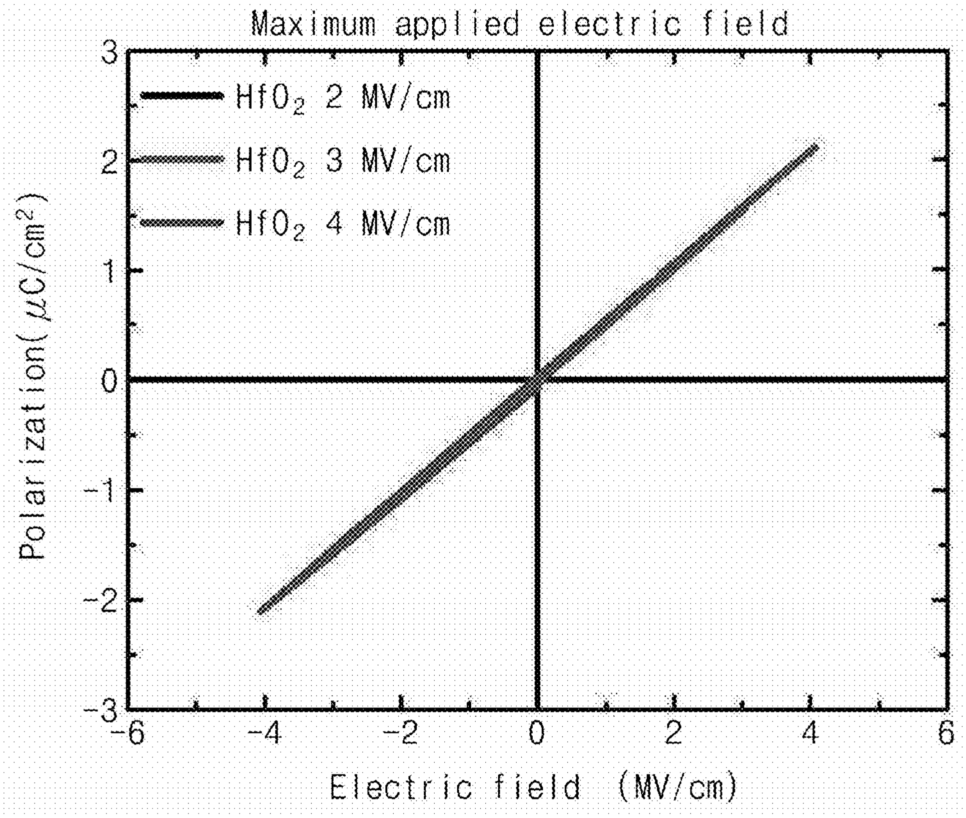
FIG. 3 is a diagram illustrating an experimental result indicating a relationship between polarization P and an electric field E of a high-κ dielectric material ($HfO_2$).

FIG. 3 is a diagram illustrating an experimental result indicating a relationship between polarization P and an electric field E of a high-κ dielectric material ($HfO_2$).

Referring to FIG. 3, a sample has a stacked structure in which a lower electrode, a dielectric layer, an upper electrode ($Mo/HfO_2/Mo$) are sequentially stacked. Polarization P was measured while changing a voltage (or an electric field) between the lower electrode and the upper electrodes. The polarization P has a linear proportional relationship with an electric field E. A maximum applied electric field was measured at 2 MV/cm, 3 MV/cm, and 4 MV/cm, respectively. The polarization P depending on the electric field E is linearly changed. When strength of the electric field is 2 MV/cm, a value of the polarization P is about 1 $\mu C/cm^2$. When the electric field is zero, remanent polarization is zero. However, induced polarization is small under a predetermined non-zero electric field.

Figure 4:
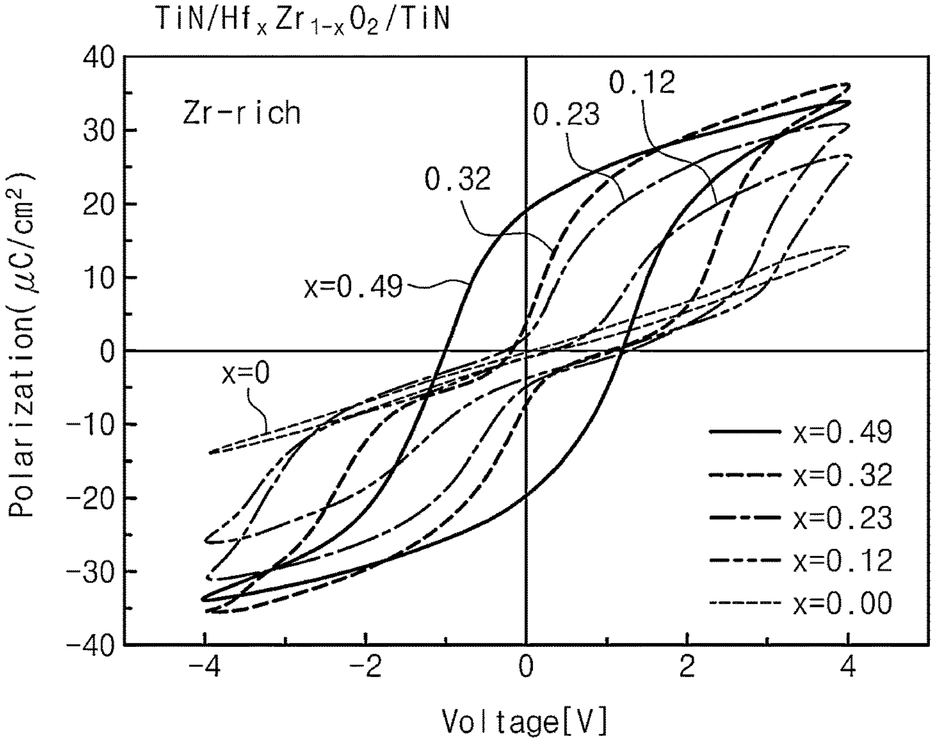
FIG. 4 is a diagram illustrating an experimental result indicating a relationship between polarization P and a voltage V depending on a composition ratio of $Hf_xZr_{1-x}O_2$.

Referring to FIG. 4, a sample has a stack structure in which a lower electrode, a dielectric layer, and an upper electrode ($TiN/Hf_xZr_{1-x}O_2/TiN$) are sequentially stacked. According to a composition ratio x of Hf, $Hf_xZr_{1-x}O_2$ may be formed of a high-κ dielectric material, an antiferroelectric material, and a ferroelectric material. When x=0, $ZrO_2$ may exhibits typical dielectric properties. When x=0.12, 0.23, or 0.32, $Hf_xZr_{1-x}O_2$ may exhibit antiferroelectric properties. On the other hand, when x=0.49, $Hf_xZr_{1-x}O_2$ may exhibit ferroelectric properties. When x=0.23 or 0.32, improved antiferroelectric properties having high polarization (about 20 $\mu C/cm^2$) may be exhibited with respect to an applied voltage of about 2 V.

Figure 5:
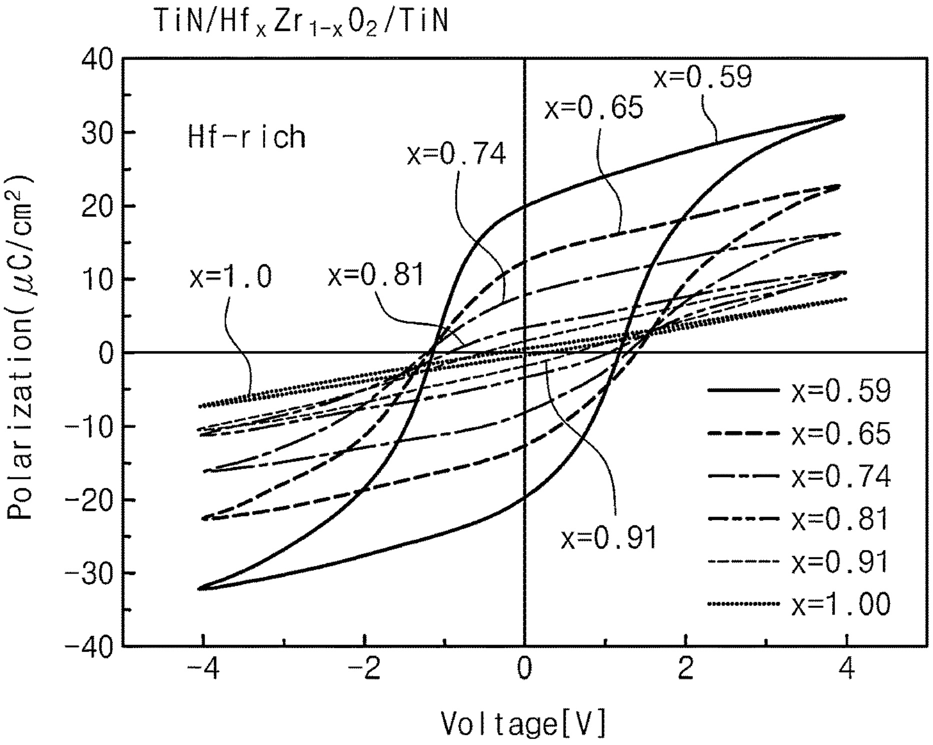
FIG. 5 is a diagram illustrating an experimental result indicating a relationship between polarization P and a voltage V depending on a composition ratio of $Hf_xZr_{1-x}O_2$.

Referring to FIG. 5, a sample has a stack structure in which a lower electrode, a dielectric layer, and upper electrode ($TiN/Hf_xZr_{1-x}O_2/TiN$) are sequentially stacked. When x=0.59, 0.65, 0.74, 0.81, or 0.91, $Hf_xZr_{1-x}O_2$ may exhibit ferroelectric properties. On the other hand, when x=1, $HfO_2$ may exhibit typical dielectric properties.

Therefore, the structure in which the lower electrode, the dielectric layer, the ferromagnetic layer, and the upper electrode ($Mo/HfO_2/Co/Mo$) are sequentially stacked may have reduced magnetic anisotropy energy in the same magnetic field, as compared with a structure in which a lower electrode, an antiferroelectric layer, a ferromagnetic layer, and an upper electrode ($Mo/Hf_{0.35}Zr_{0.65}O_2/Co/Mo$) are sequentially stacked.

Figure 6A:
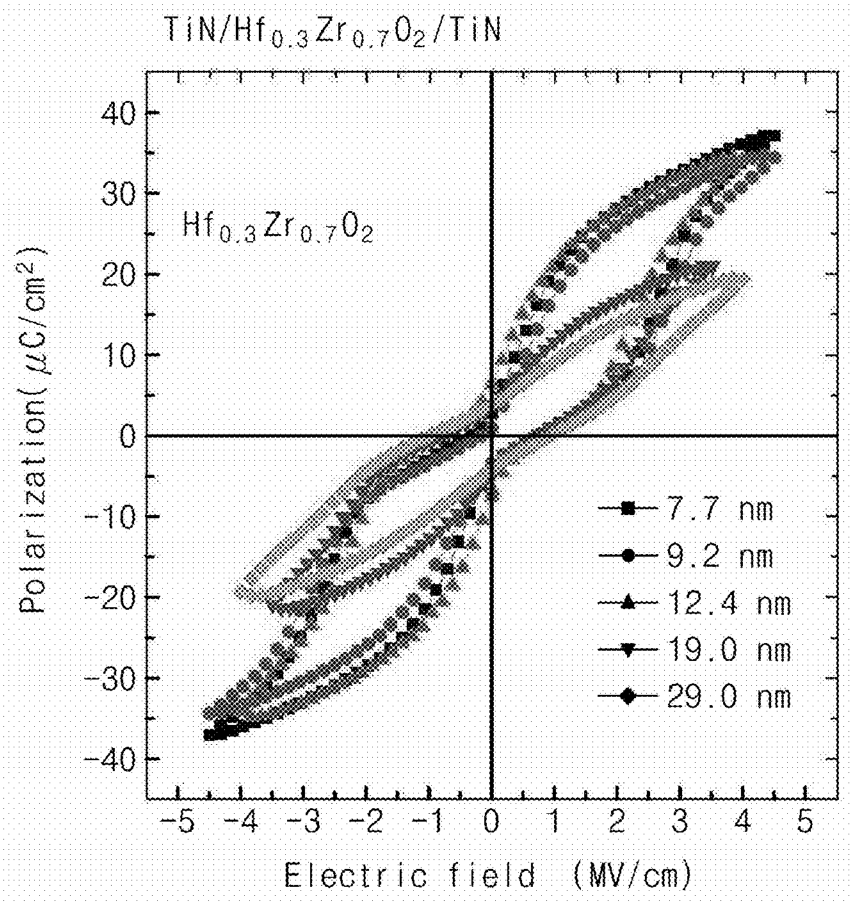
FIG. 6A is a diagram illustrating an experimental result indicating a relationship between polarization P and an electric field E depending on a thickness of $Hf_{0.3}Zr_{0.7}O_2$.

FIG. 6A is a diagram illustrating an experimental result indicating a relationship between polarization P and an electric field E depending on a thickness of $Hf_{0.3}Zr_{0.7}O_2$.

Figure 6B:
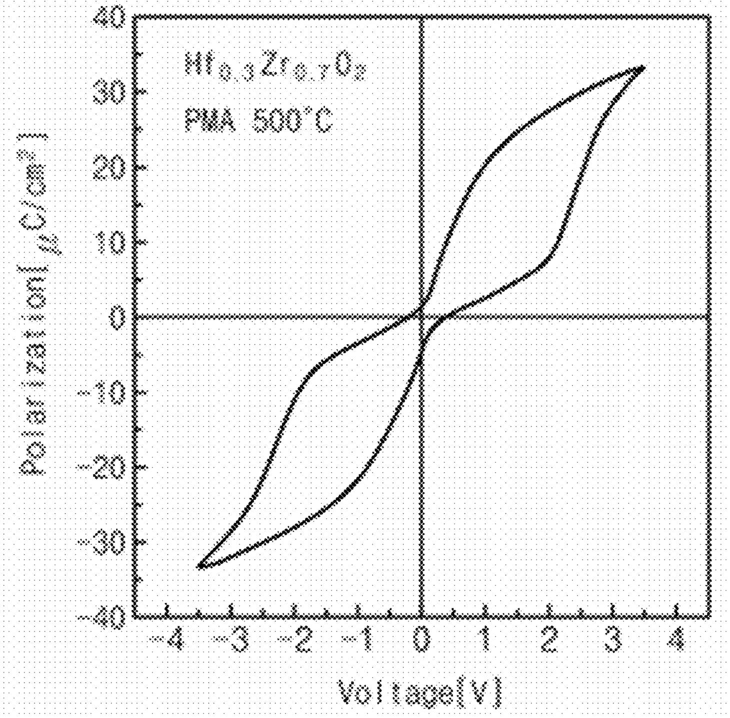
FIG. 6B is a diagram illustrating an experimental result indicating a relationship between polarization P and an electric field E in $Hf_{0.3}Zr_{0.7}O_2$.

FIG. 6B is a diagram illustrating an experimental result indicating a relationship between polarization P and an electric field E in $Hf_{0.3}Zr_{0.7}O_2$.

Figure 6C:
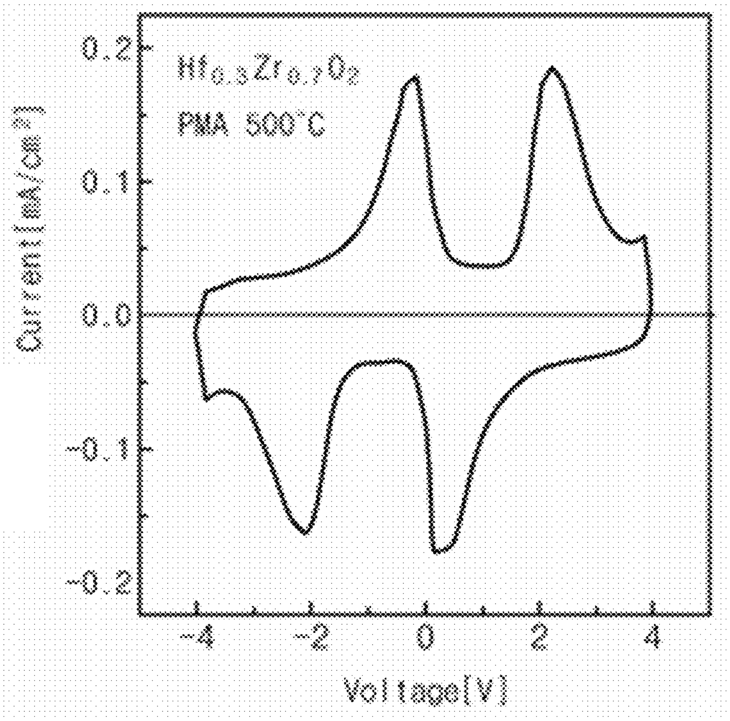
FIG. 6C is a diagram illustrating an experimental result indicating a relationship between current and a voltage V in $Hf_{0.3}Zr_{0.7}O_2$ of FIG. 6B.

FIG. 6C is a diagram illustrating an experimental result indicating a relationship between current and a voltage V in $Hf_{0.3}Zr_{0.7}O_2$ of FIG. 6B.

Referring to FIG. 6A, a sample has a structure in which a lower electrode, a dielectric layer, and upper electrode ($TiN/Hf_xZr_{1-x}O_2/TiN$) are sequentially stacked. A thicknesses of $Hf_{0.3}Zr_{0.7}O_2$ may be 7.7 nm, 9.2 nm, 12.4 nm, 19.0 nm, or 29.0 nm.

When the thicknesses of $Hf_{0.3}Zr_{0.7}O_2$ is 7.7 nm, 9.2 nm, or 12.4 nm, polarization P depending on an electric field E may have a high value. When the electric field E is zero, the polarization P may approximate zero. For example, when the thickness of $Hf_{0.3}Zr_{0.7}O_2$ is 7.7 nm, 9.2 nm, or 12.4 nm, the antiferroelectric layer may approximate an ideal Polarization-Field (P-E) hysteresis loop.

However, when the thicknesses of $Hf_{0.3}Zr_{0.7}O_2$ is 19.0 nm or 29.0 nm, the P-E hysteresis loop may be distorted from the ideal P-E hysteresis loop and a polarization value may also be relatively reduced.

Referring to FIGS. 6B and 6C, a sample was subjected to post-metal annealing (PMA) at a temperature of 500° C. The antiferroelectric layer ($Hf_{0.3}Zr_{0.7}O_2$) may approximate an ideal P-E hysteresis loop. The antiferroelectric layer ($Hf_{0.3}Zr_{0.7}O_2$) may have a single peak in each of first, second, third, and fourth quadrants in an I-V hysteresis loop of voltage-dependent current.

Figure 7A:
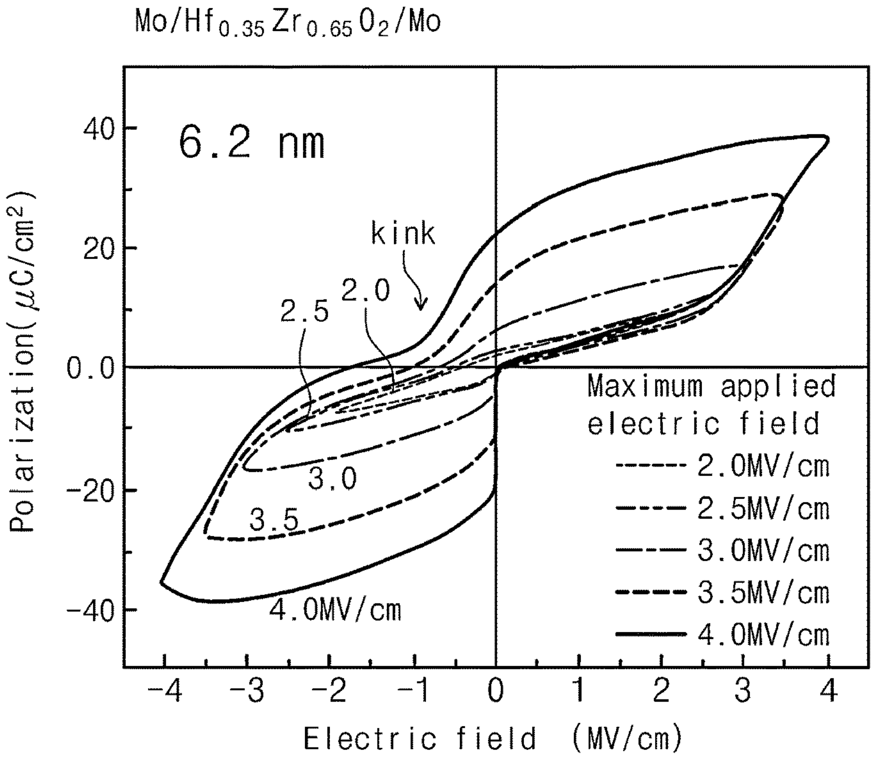
FIG. 7A is a diagram illustrating an experimental result indicating a relationship between polarization P and an electric field E when $Hf_{0.35}Zr_{0.65}O_2$ has a thickness of 6.2 nm.

FIG. 7A is a diagram illustrating an experimental result indicating a relationship between polarization P and an electric field E when $Hf_{0.35}Zr_{0.65}O_2$ has a thickness of 6.2 nm.

Figure 7B:
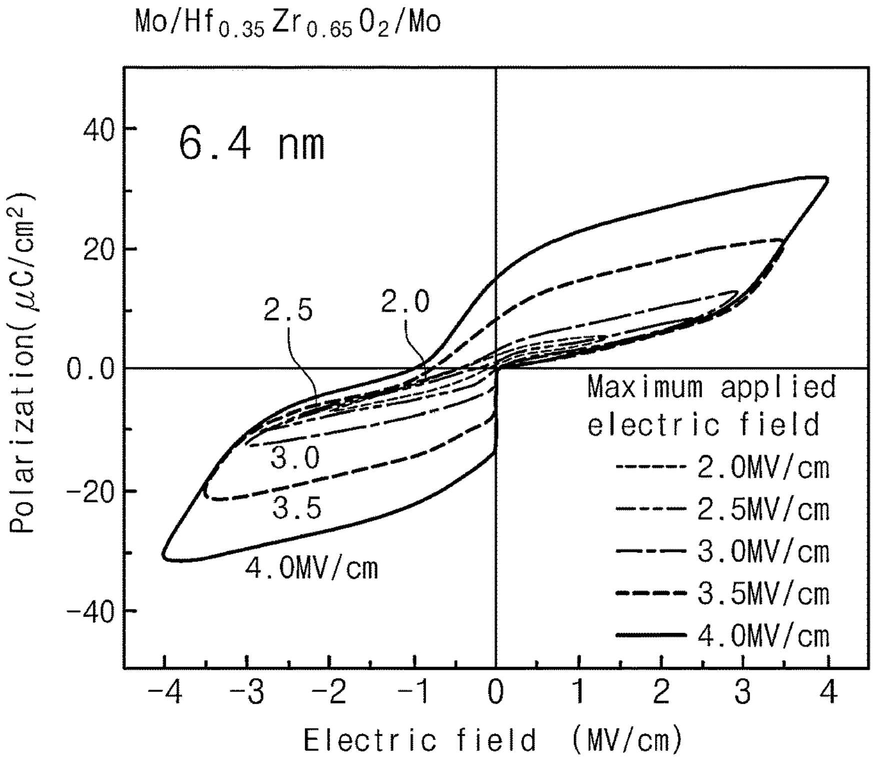
FIG. 7B is a diagram illustrating an experimental result indicating a relationship between polarization P and an electric field E when $Hf_{0.35}Zr_{0.65}O_2$ has a thickness of 6.4 nm.

FIG. 7B is a diagram illustrating an experimental result indicating a relationship between polarization P and an electric field E when $Hf_{0.35}Zr_{0.65}O_2$ has a thickness of 6.4 nm.

Figure 7C:
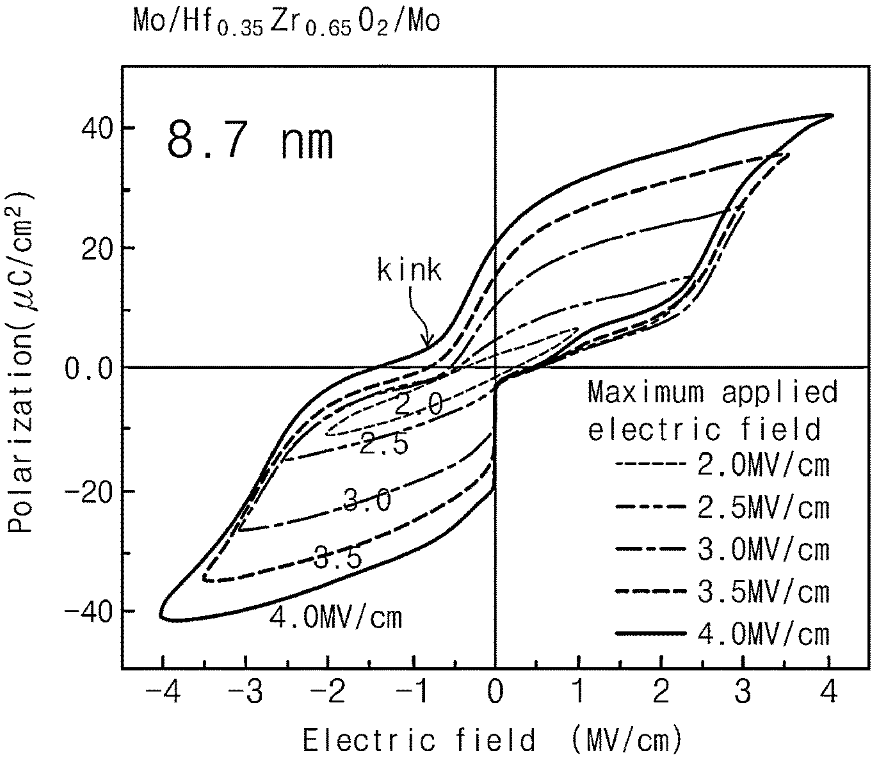
FIG. 7C is a diagram illustrating an experimental result indicating a relationship between polarization P and an electric field E when $Hf_{0.35}Zr_{0.65}O_2$ has a thickness of 8.7 nm.

FIG. 7C is a diagram illustrating an experimental result indicating a relationship between polarization P and an electric field E when $Hf_{0.35}Zr_{0.65}O_2$ has a thickness of 8.7 nm.

Figure 7D:
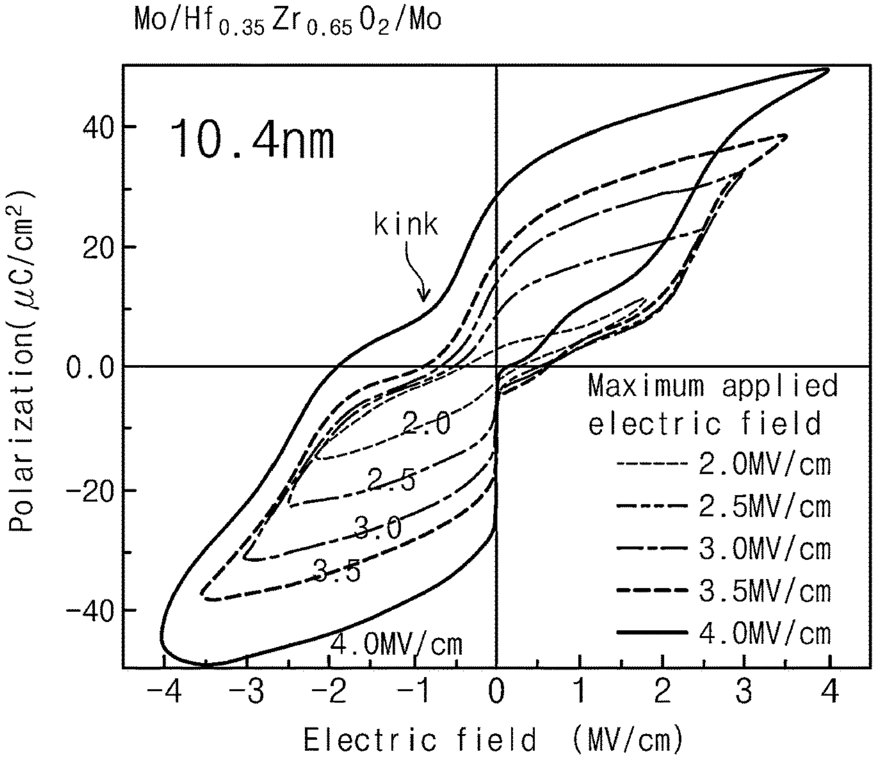
FIG. 7D is a diagram illustrating an experimental result indicating a relationship between polarization P and an electric field E when $Hf_{0.35}Zr_{0.65}O_2$ has a thickness of 10.4 nm.

FIG. 7D is a diagram illustrating an experimental result indicating a relationship between polarization P and an electric field E when $Hf_{0.35}Zr_{0.65}O_2$ has a thickness of 10.4 nm.

Referring to FIGS. 7A to 7D, a sample has a stack of a lower electrode, a dielectric layer, and an upper electrode ($Mo/Hf_{0.35}Zr_{0.65}O_2/Mo$) are sequentially stacked. The sample was measured at maximum applied electric fields of 2.0 MV/cm, 2.5 MV/cm, 3.0 MV/cm, 3.5 MV/cm, and 4.0 MV/cm, respectively.

In a P-E hysteresis loop, $[Hf_{0.35}Zr_{0.65}]O_2$ does not exhibit perfect antiferroelectric properties, but has properties of a mixture in which ferroelectric and antiferroelectric properties are mixed.

A change in polarization depending on an electric field depending on a thickness of $[Hf_{0.35}Zr_{0.65}]O_2$ was measured. As a sign of the electric field changes, a kink is observed in the second quadrant of the P-E hysteresis loop.

Figure 8A:
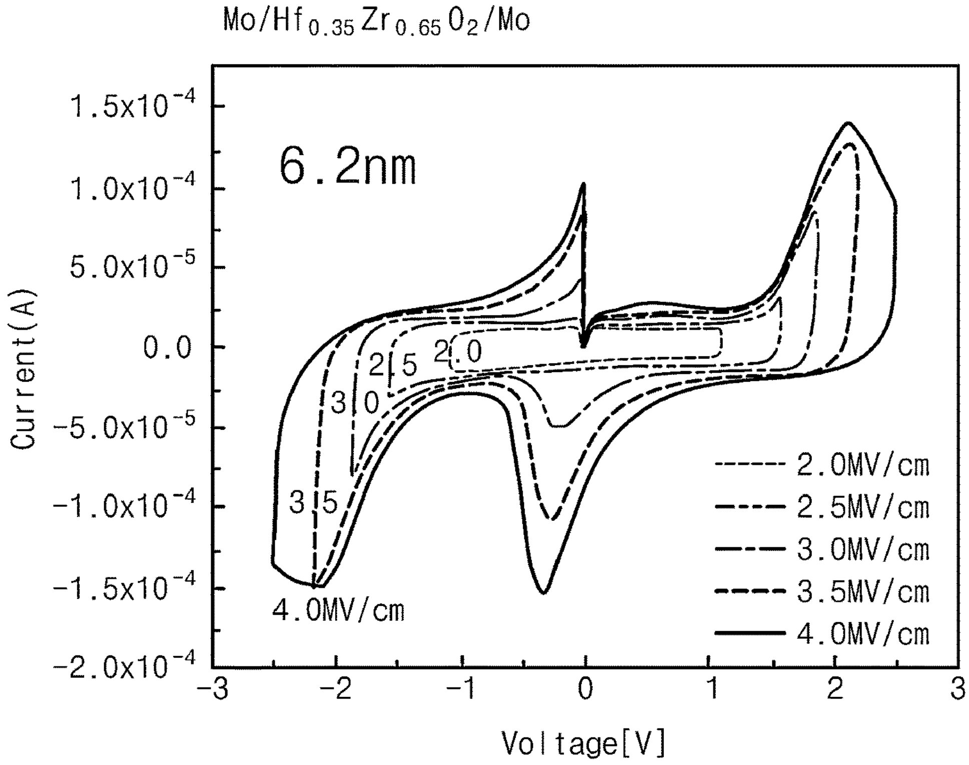
FIG. 8A is a diagram illustrating an experimental result indicating a relationship between current I and a voltage V when $Hf_{0.35}Zr_{0.65}O_2$ has a thickness of 6.2 nm.

FIG. 8A is a diagram illustrating an experimental result indicating a relationship between current I and a voltage V when $Hf_{0.35}Zr_{0.65}O_2$ has a thickness of 6.2 nm.

Figure 8B:
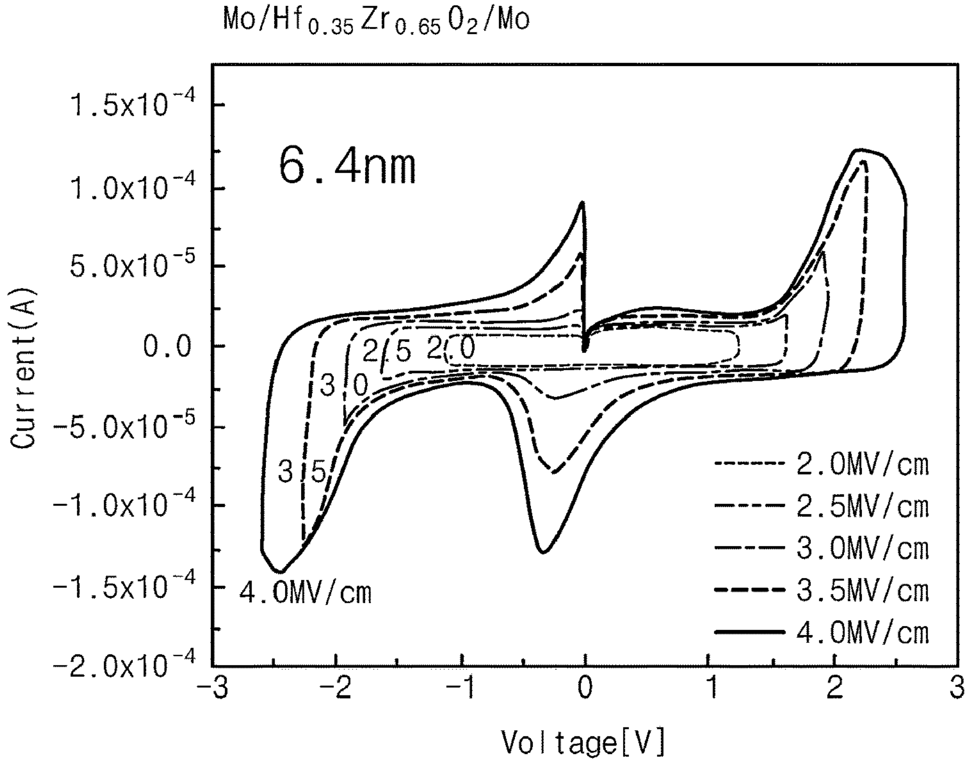
FIG. 8B is a diagram illustrating an experimental result indicating a relationship between current I and a voltage V when $Hf_{0.35}Zr_{0.65}O_2$ has a thickness of 6.4 nm.

FIG. 8B is a diagram illustrating an experimental result indicating a relationship between current I and a voltage V when $Hf_{0.35}Zr_{0.65}O_2$ has a thickness of 6.4 nm.

Figure 8C:
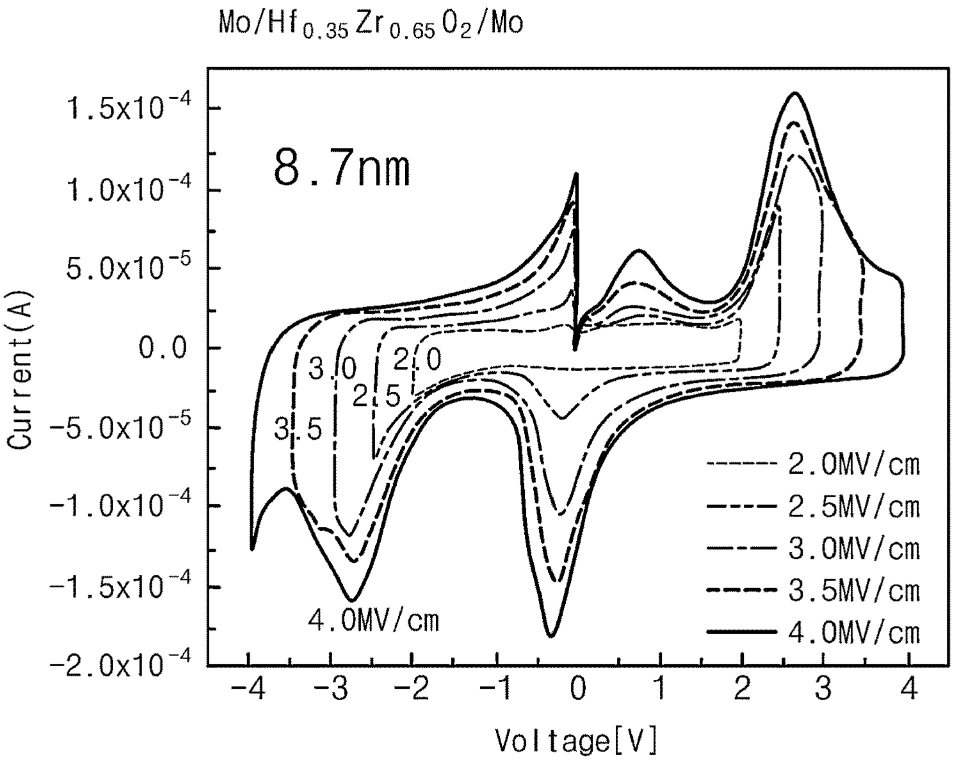
FIG. 8C is a diagram illustrating an experimental result indicating a relationship between current I and a voltage V when $Hf_{0.35}Zr_{0.65}O_2$ has a thickness of 8.7 nm.

FIG. 8C is a diagram illustrating an experimental result indicating a relationship between current I and a voltage V when $Hf_{0.35}Zr_{0.65}O_2$ has a thickness of 8.7 nm.

Figure 8D:
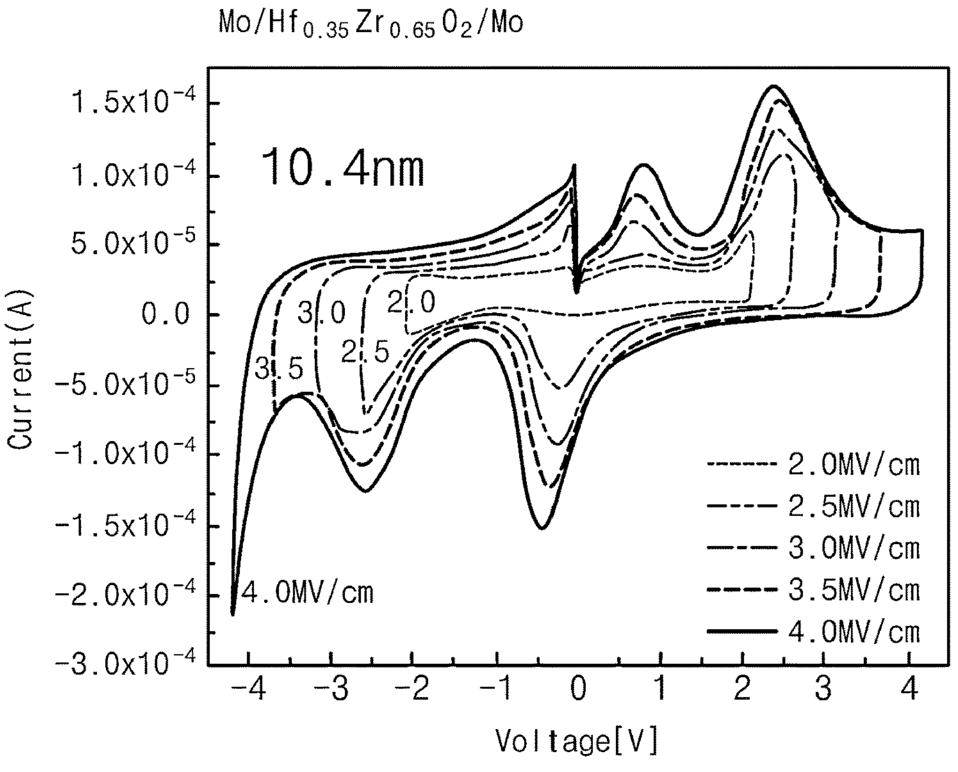
FIG. 8D is a diagram illustrating an experimental result indicating a relationship between current I and a voltage V when $Hf_{0.35}Zr_{0.65}O_2$ has a thickness of 10.4 nm.

FIG. 8D is a diagram illustrating an experimental result indicating a relationship between current I and a voltage V when $Hf_{0.35}Zr_{0.65}O_2$ has a thickness of 10.4 nm.

Referring to FIGS. 8A to 8D, the sample has a structure in which a lower electrode, a dielectric layer, and an upper electrode ($Mo/Hf_{0.35}Zr_{0.65}O_2/Mo$) are sequentially stacked. In the case of antiferroelectric properties, an I-V hysteresis loop V has two peaks in a first quadrant and two peaks in a third quadrant.

The I-V hysteresis loop has two peaks in third and fourth quadrants. One peak is present near a maximum value of the voltage, and the other peak is present near a zero voltage. Sweep of the voltage increases to a positive maximum at a voltage of 0 V, then decreases to a negative minimum through zero, then increases again and ends at a voltage of 0 V. Accordingly, the peak near at a voltage of 0 V, at which the sweep ends, finally appear to be cut but may be treated as being continuously connected at a positive voltage.

More specifically, in the antiferroelectric layer, a first peak is disposed in the first quadrant and a second peak is disposed at a boundary between the first and second quadrants in the I-V hysteresis loop. In the antiferroelectric layer, a third peak is disposed in the third quadrant and a fourth peak is disposed at a boundary between the third and fourth quadrants in the I-V hysteresis loop.

Specifically, when the thickness of $Hf_{0.35}Zr_{0.65}O_2$ is 6.2 nm or 6.4 nm, it is determined that $Hf_{0.35}Zr_{0.65}O_2$ has mixed properties in which antiferroelectric properties and ferroelectric properties are mixed, and has two peaks in the first quadrant.

When the thickness of $Hf_{0.35}Zr_{0.65}O_2$ is 8.7 nm or 10.4 nm, $Hf_{0.35}Zr_{0.65}O_2$ has mixed characteristics in which antiferroelectric properties and ferroelectric properties are mixed, and the I-V hysteresis loop has two peaks in the first quadrant and two peaks in the third quadrant. More specifically, in the antiferroelectric layer, a first peak is disposed in the first quadrant and a second peak is disposed at a boundary between the first and second quadrants in the I-V hysteresis loop. In the antiferroelectric layer, a third peak is disposed in the third quadrant and a fourth peak is disposed at a boundary between the third and fourth quadrants in the I-V hysteresis loop of the voltage-dependent current.

Referring to FIG. 8D, a peak appears in a third quadrant at a negative maximum voltage, but this is determined to be a nonideal artifact properties caused by a high voltage.

Figure 9A:
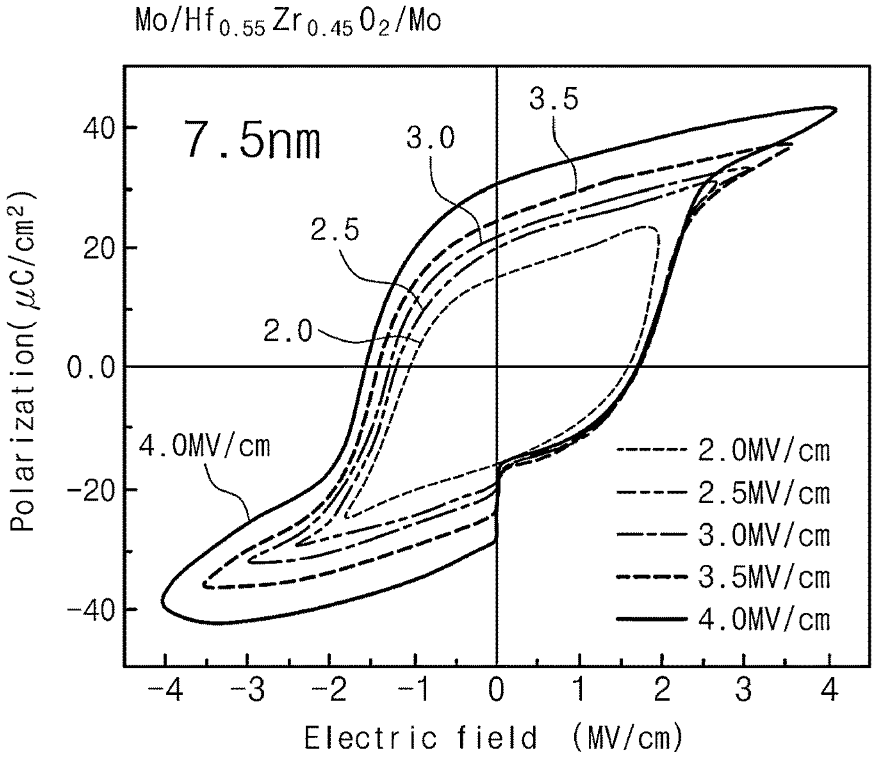
FIG. 9A is a diagram illustrating an experimental result indicating a relationship between polarization P and an electric field E of a ferroelectric layer ($Hf_{0.55}Zr_{0.45}O_2$) having a thickness of 7.5 nm.

FIG. 9A is a diagram illustrating an experimental result indicating a relationship between polarization P and an electric field E of a ferroelectric layer ($Hf_{0.55}Zr_{0.45}O_2$) having a thickness of 7.5 nm.

Figure 9B:
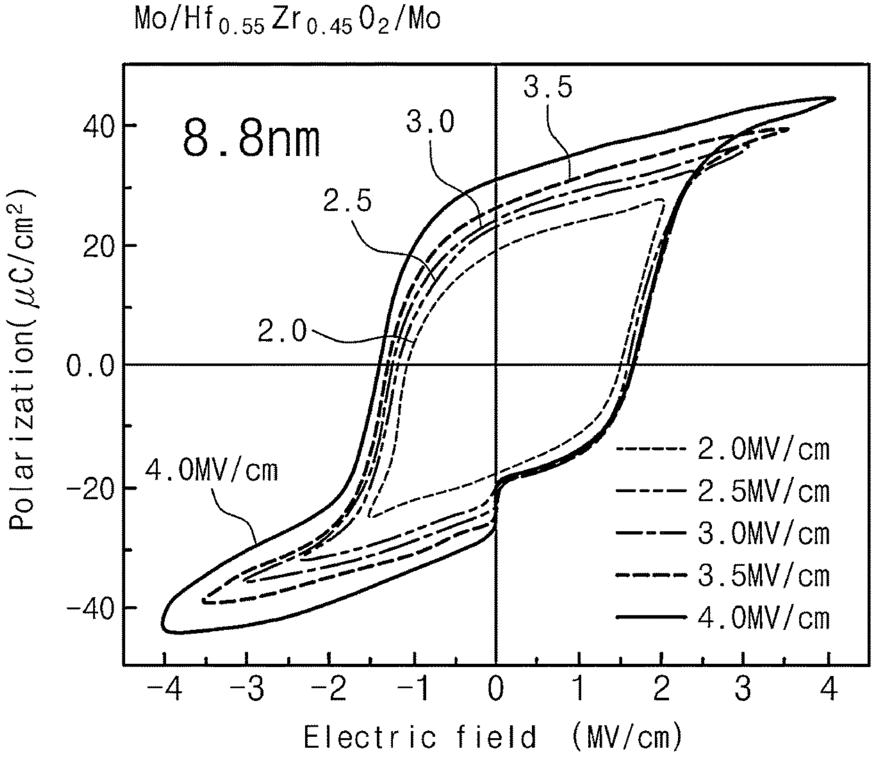
FIG. 9B is a diagram illustrating an experimental result indicating a relationship between polarization P and an electric field E of a ferroelectric layer ($Hf_{0.55}Zr_{0.45}O_2$) having a thickness of 8.8 nm.

FIG. 9B is a diagram illustrating an experimental result indicating a relationship between polarization P and an electric field E of a ferroelectric layer ($Hf_{0.55}Zr_{0.45}O_2$) having a thickness of 8.8 nm.

Figure 9C:
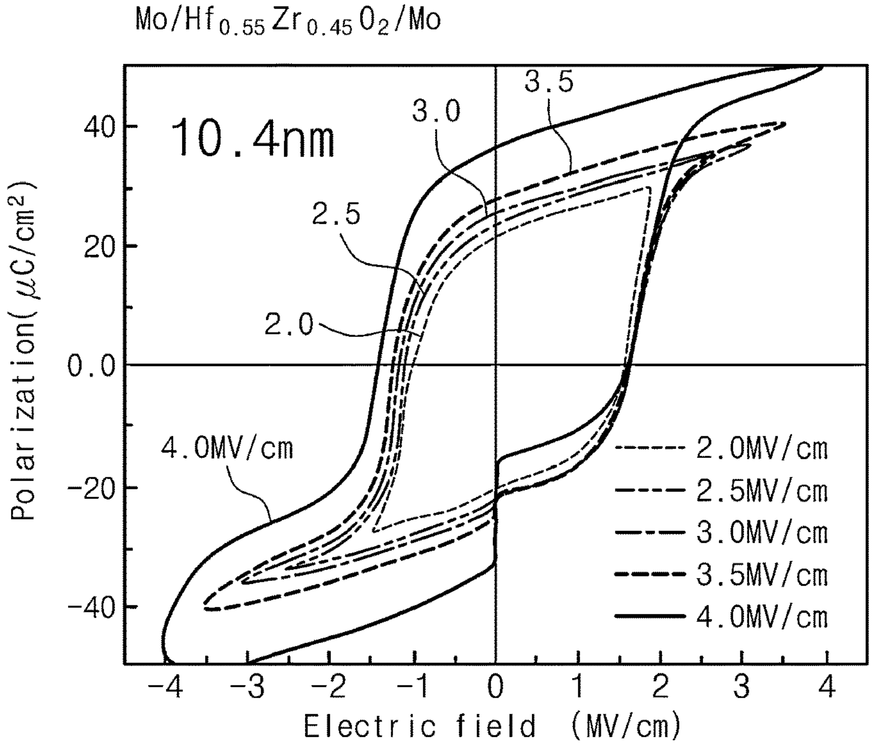
FIG. 9C is a diagram illustrating an experimental result indicating a relationship between polarization P and an electric field E of a ferroelectric layer ($Hf_{0.55}Zr_{0.45}O_2$) having a thickness of 10.4 nm.

FIG. 9C is a diagram illustrating an experimental result indicating a relationship between polarization P and an electric field E of a ferroelectric layer ($Hf_{0.55}Zr_{0.45}O_2$) having a thickness of 10.4 nm.

Figure 9D:
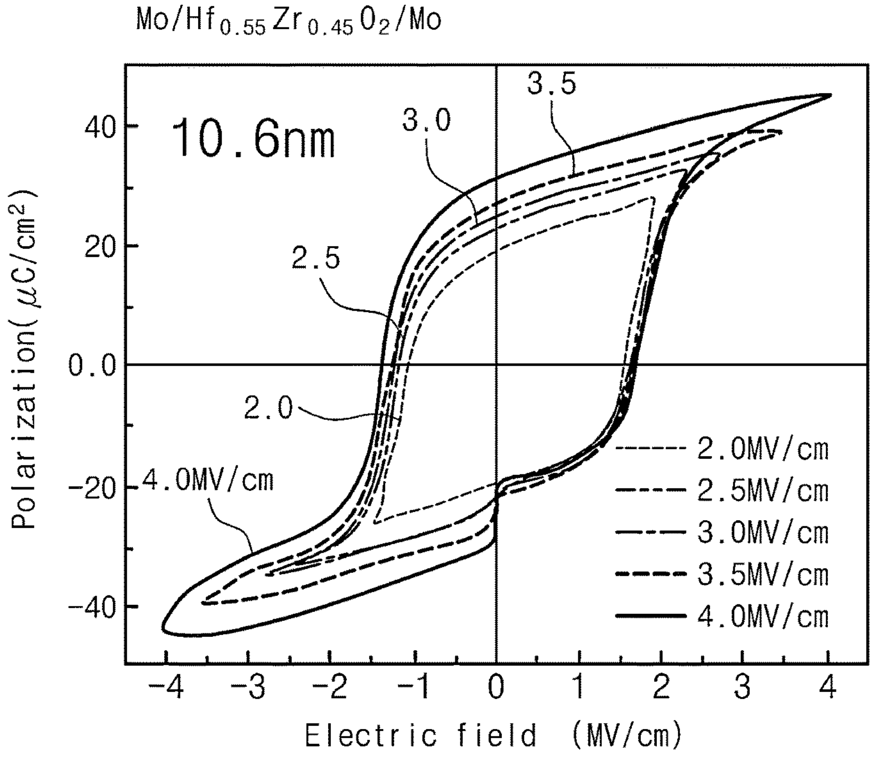
FIG. 9D is a diagram illustrating an experimental result indicating a relationship between polarization P and an electric field E of a ferroelectric layer ($Hf_{0.55}Zr_{0.45}O_2$) having a thickness of 10.6 nm.

FIG. 9D is a diagram illustrating an experimental result indicating a relationship between polarization P and an electric field E of a ferroelectric layer ($Hf_{0.55}Zr_{0.45}O_2$) having a thickness of 10.6 nm.

Referring to FIGS. 9A to 9D, a sample has a structure in which a lower electrode, a dielectric layer, and an upper electrode ($Mo/Hf_{0.55}Zr_{0.45}O_2/Mo$) are sequentially stacked. When a voltage or an electric field becomes zero, polarization may not exhibit a property of approximating zero. For example, $Hf_{0.55}Zr_{0.45}O_2$ may exhibit only ferroelectric properties, rather than antiferroelectric properties.

For example, in a P-E hysteresis loop depending on a thickness of $[Hf_{0.55}Zr_{0.45}]O_2$, high remnant polarization may be present even when the electric field is zero (0).

Figure 10A:
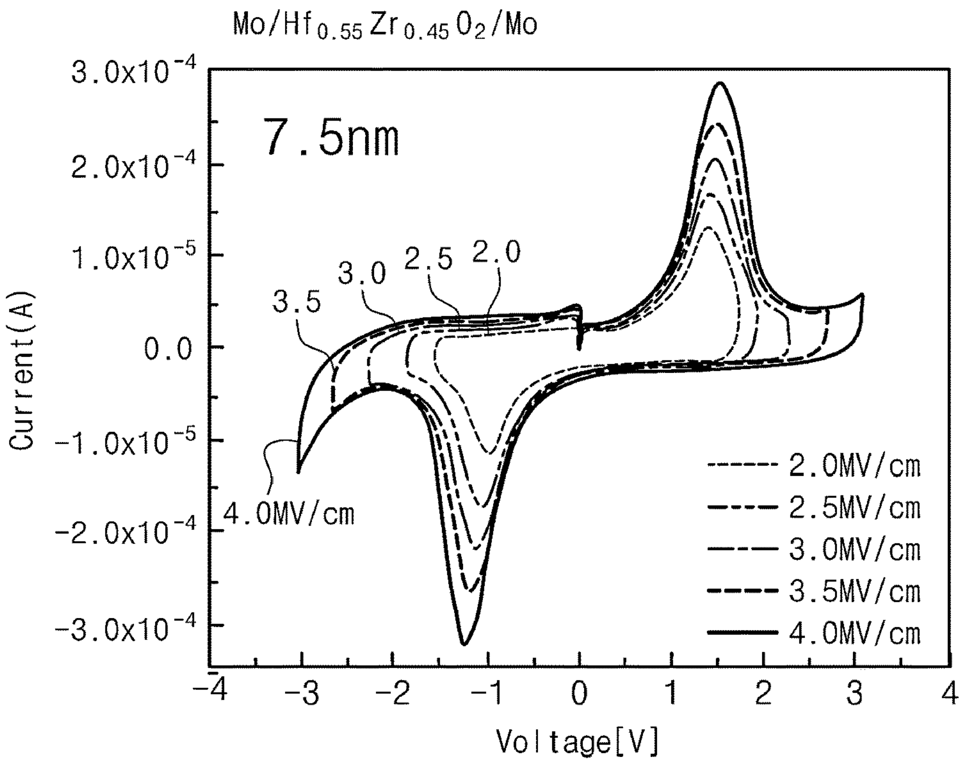
FIG. 10A is a diagram illustrating an experimental result indicating a relationship between current I and a voltage V of a ferroelectric layer ($Hf_{0.55}Zr_{0.45}O_2$) having a thickness of 7.5 nm.

FIG. 10A is a diagram illustrating an experimental result indicating a relationship between current I and a voltage V of a ferroelectric layer ($Hf_{0.55}Zr_{0.45}O_2$) having a thickness of 7.5 nm.

Figure 10B:
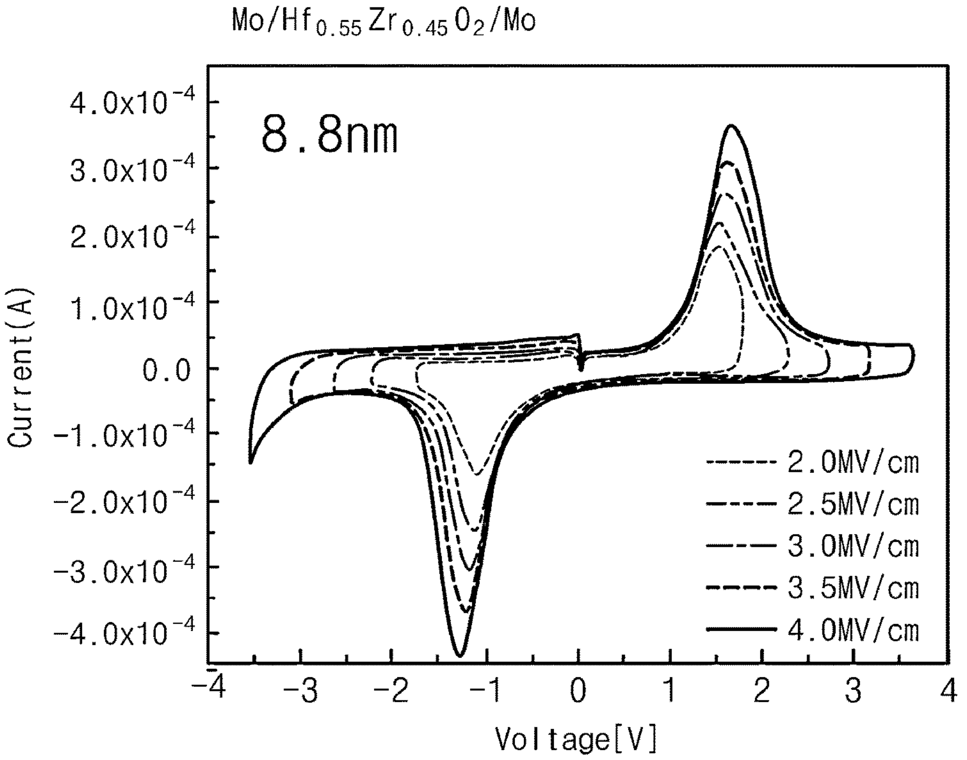
FIG. 10B is a diagram illustrating an experimental result indicating a relationship between current I and a voltage V of a ferroelectric layer ($Hf_{0.55}Zr_{0.45}O_2$) having a thickness of 8.8 nm.

FIG. 10B is a diagram illustrating an experimental result indicating a relationship between current I and a voltage V of a ferroelectric layer ($Hf_{0.55}Zr_{0.45}O_2$) having a thickness of 8.8 nm.

Figure 10C:
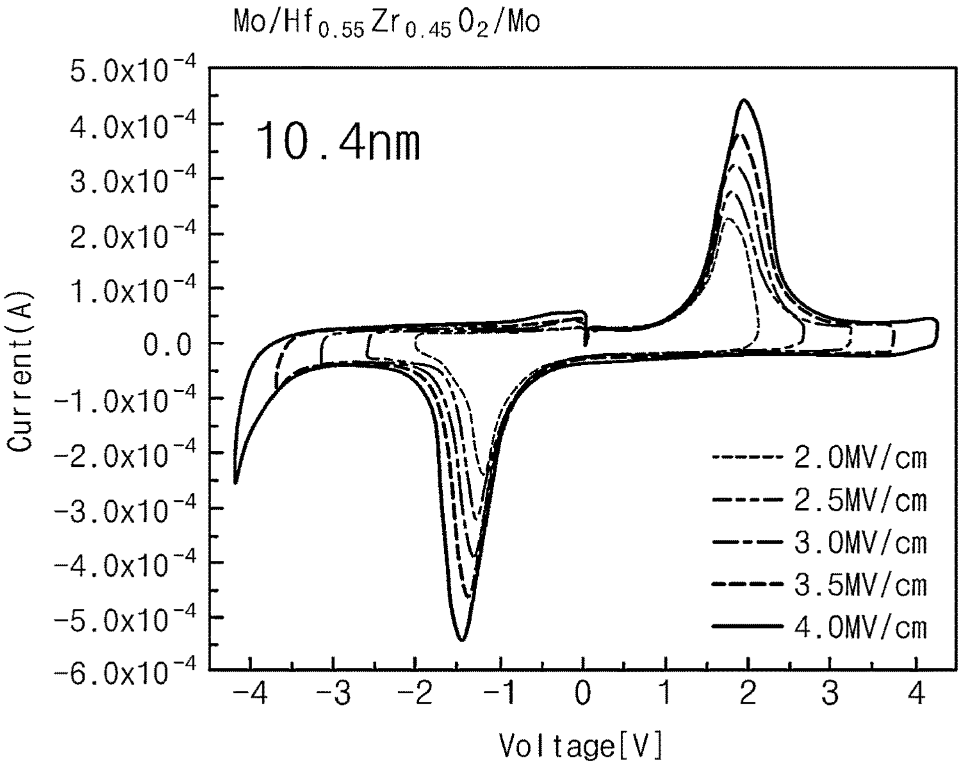
FIG. 10C is a diagram illustrating an experimental result indicating a relationship between current I and a voltage V of a ferroelectric layer ($Hf_{0.55}Zr_{0.45}O_2$) having a thickness of 10.4 nm.

FIG. 10C is a diagram illustrating an experimental result indicating a relationship between current I and a voltage V of a ferroelectric layer ($Hf_{0.55}Zr_{0.45}O_2$) having a thickness of 10.4 nm.

Figure 10D:
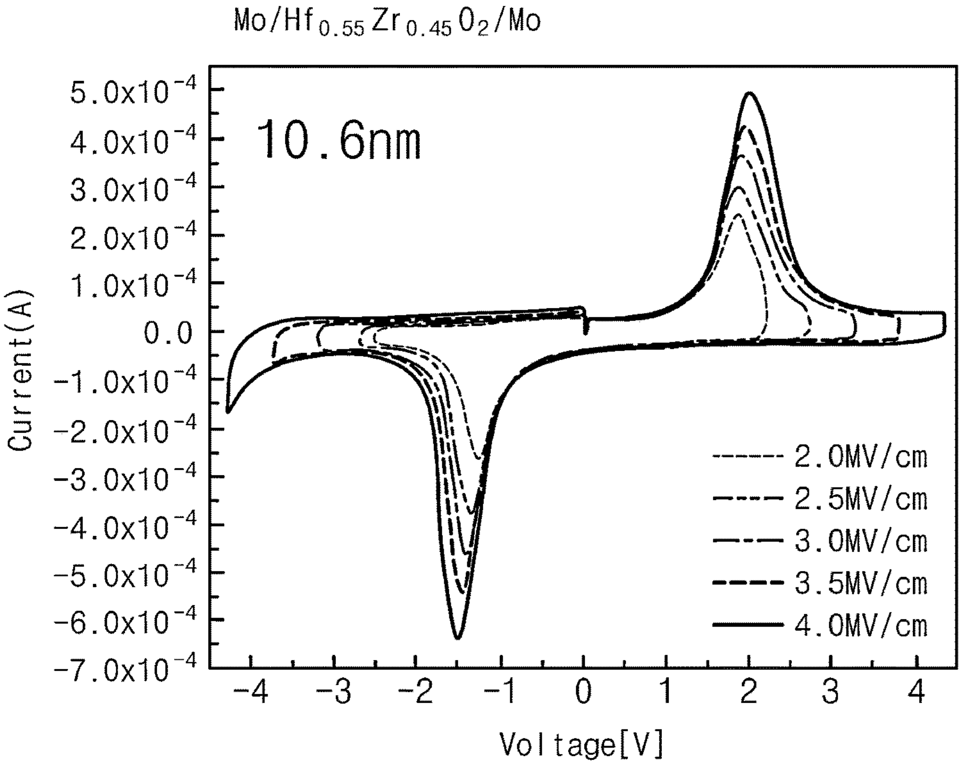
FIG. 10D is a diagram illustrating an experimental result indicating a relationship between current I and a voltage V of a ferroelectric layer ($Hf_{0.55}Zr_{0.45}O_2$) having a thickness of 10.6 nm.

FIG. 10D is a diagram illustrating an experimental result indicating a relationship between current I and a voltage V of a ferroelectric layer ($Hf_{0.55}Zr_{0.45}O_2$) having a thickness of 10.6 nm.

Referring to FIGS. 10A to 10D, a sample has a structure in which a lower electrode, a dielectric layer, and an upper electrode ($Mo/Hf_{0.55}Zr_{0.45}O_2/Mo$) are sequentially stacked. In a current-voltage (I-V) loop, a single peak appears in each of first and second quadrants. Accordingly, the sample is determined to be a ferroelectric material. However, two peaks appear to be present in a third quadrant, but a peak appearing at a negative maximum voltage is determined to be a nonideal artifact properties caused by a high voltage.

Figure 11:
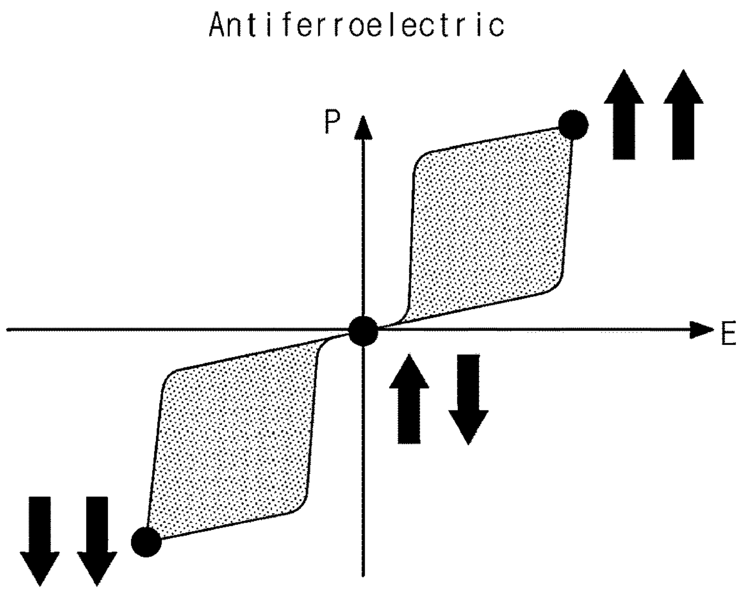
FIGS. 11 and 12 are diagrams illustrating P-E hysteresis loops of an ideal antiferroelectric material and a ferroelectric material.
Figure 12:
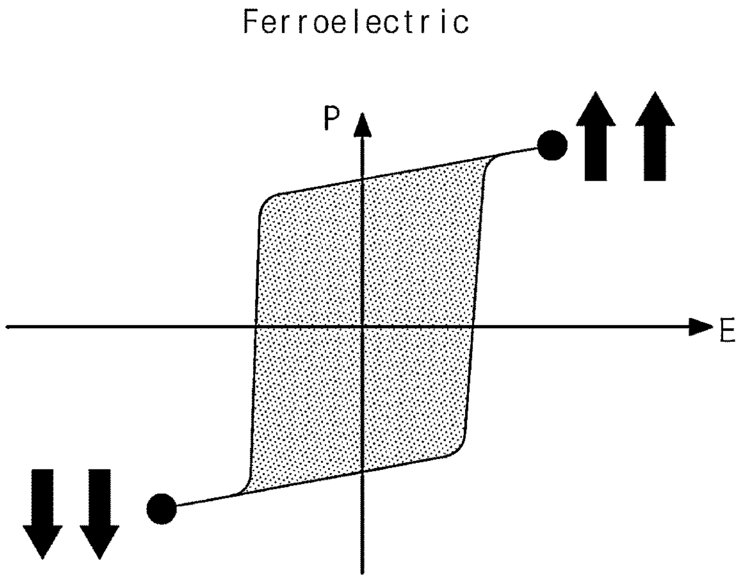

FIGS. 11 and 12 are diagrams illustrating P-E hysteresis loops of an ideal antiferroelectric material and a ferroelectric material, respectively.

Referring to FIG. 11, when an electric field E is zero in an antiferroelectric material, polarization P may approximate zero. On the other hand, when an electric field E is zero in a ferroelectric material, polarization P may be maintained at a value slightly lower than a saturated value, for example, a non-zero remnant polarization value shown in FIG. 12.

Figure 13:
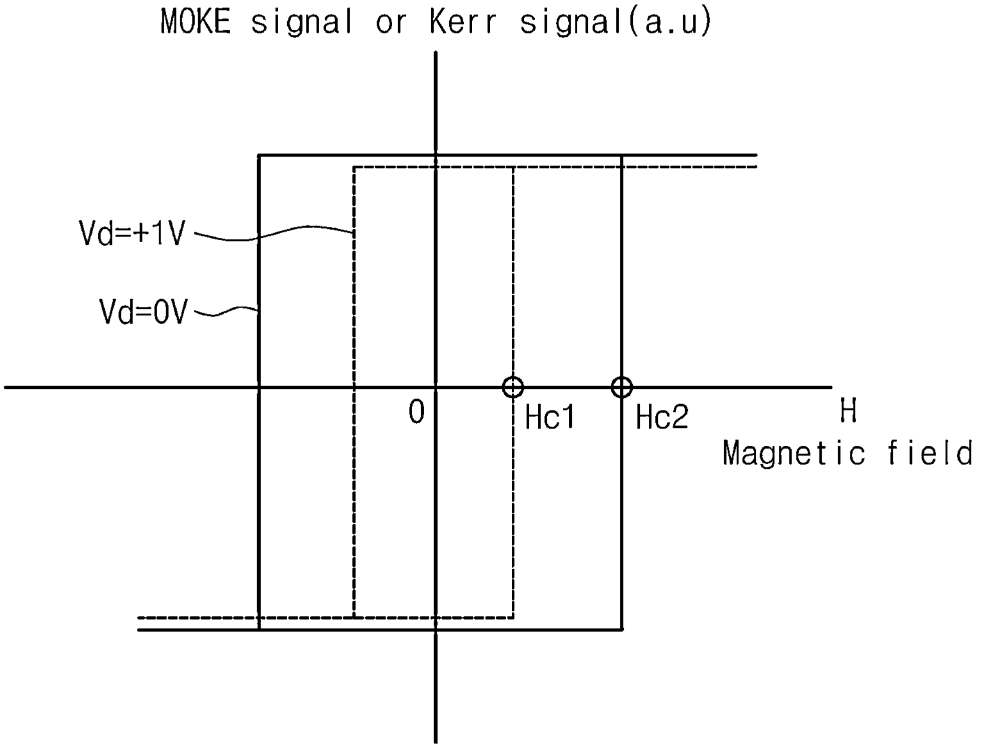
FIG. 13 is a graph illustrating an experimental result of magneto-optic Kerr effect (MOKE) indicating a magnetization hysteresis state of a ferromagnetic layer depending on strength of a magnetic field H in a stack structure in which a lower conductive layer, an antiferroelectric layer, a ferromagnetic layer, and an upper conductive layer according to an example embodiment are sequentially stacked.

FIG. 13 is a graph illustrating an experimental result of magneto-optic Kerr effect (MOKE) indicating a magnetization state of a ferromagnetic layer depending on strength of a magnetic field H in a stack structure in which a lower conductive layer, an antiferroelectric layer, a ferromagnetic layer, and an upper conductive layer according to an example embodiment are sequentially stacked.

FIG. 13 illustrates a change in a magneto-optic Kerr effect (MOKE) signal depending on a change in a magnetic field H under an applied voltage Vd between a lower conductive layer and an upper conductive layer. A sample has a structure in which a lower conductive layer, an antiferroelectric layer, a ferromagnetic layer, a first upper conductive layer, and a second upper conductive layer ($Mo/Hf_{0.35}Zr_{0.65}O_2/Co/Pd/Ta$) are sequentially stacked. The MOKE signal is measured depending on a direction and strength of an external magnetic field H. The MOKE signal depending on the external magnetic field H represents a magnetic hysteresis loop of the ferromagnetic layer. As the magnetic field is increased, a magnetic field in which switching of the magnetization direction occurs is coercive force Hc. Coercive forces of Hc1 and Hc2 may vary depending on the applied voltage Vd.

For example, when the applied voltage Vd is increased, polarization of the ferroelectric may be increased and coercive force Hc or magnetic anisotropy energy of an adjacent ferromagnetic layer may be decreased due to the polarization. Accordingly, magnetization of the ferromagnetic layer may be easily reversed by the magnetic field.

Figure 14A:
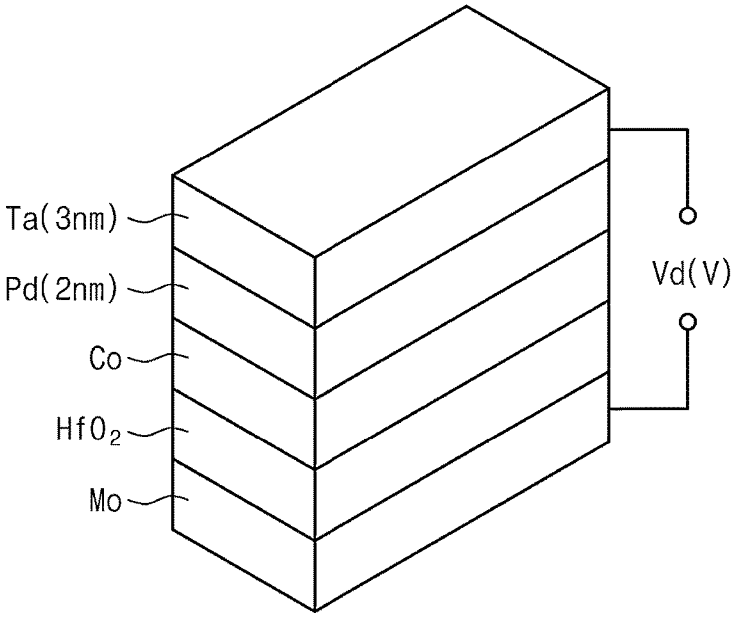
FIG. 14A is a diagram illustrating a sample structure of a dielectric material ($HfO_2$).

FIG. 14A is a diagram illustrating a sample structure with a dielectric material ($HfO_2$).

Figure 14B:
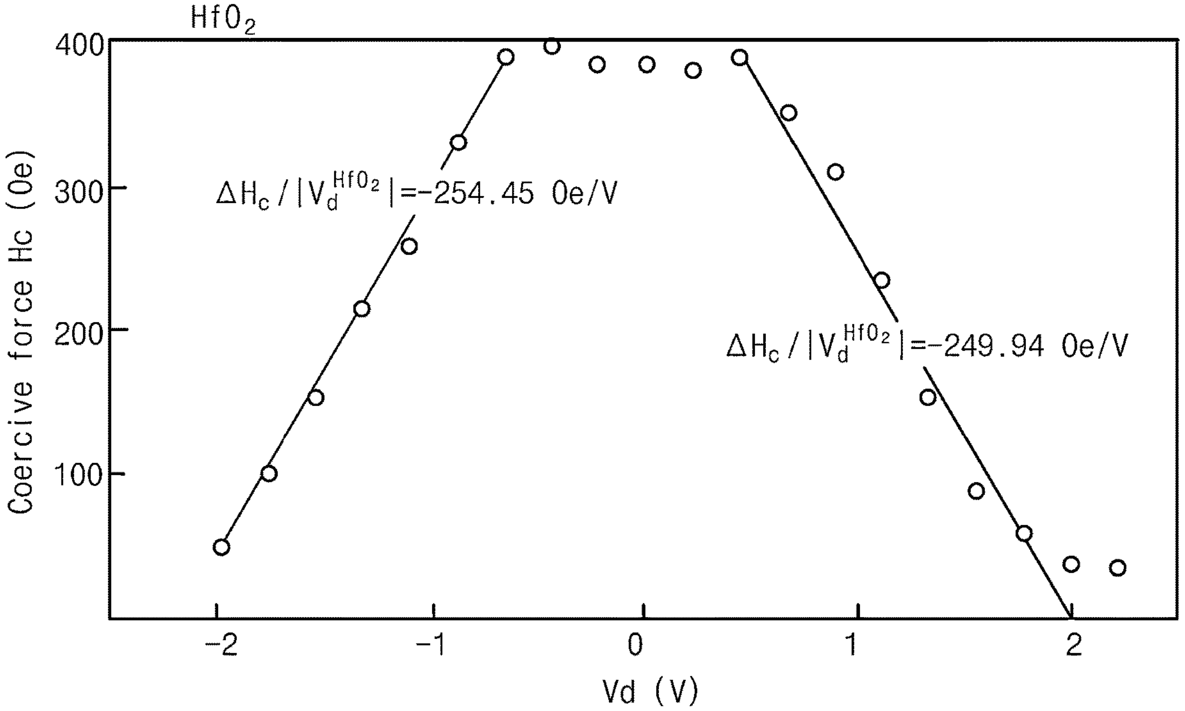
FIG. 14B is an experimental result obtained by measuring and analyzing a decrease in coercive force depending on an applied voltage Vd applied to the sample of FIG. 14*a* using a magneto-optical Kerr effect (MOKE).

FIG. 14B is an experimental result obtained by measuring and analyzing a decrease in coercive force depending on an applied voltage Vd applied to the sample of FIG. 14A by magneto-optical Kerr effect (MOKE) magnetometry.

Referring to FIGS. 14A and 14B, a sample has a structure in which a lower conductive layer, a high-κ dielectric layer, a ferromagnetic layer, a first upper conductive layer, and a second upper conductive layer ($Mo/HfO_2/Co/Pd/Ta$) are sequentially stacked. Coercive force Hc exhibits a symmetrical characteristic depending on a sign of an applied voltage Vd. The coercive force may have a value of 36.2 Oe at an applied voltage Vd of about 2.21 V, and may have a value of 385.0 Oe at an applied voltage Vd of about 0 V. A slope of coercive force depending on a positive applied voltage Vd may be −249.94 Oe/V, and a slope of coercive force depending on a negative applied voltage Vd may be +254.45 Oe/V.

Since the coercive force is decreased as a magnitude of the applied voltage is increase, it can be seen that magnetization reversal is easily performed. Since the material of the ferromagnetic layer is not changed, it can be seen that a decrease in coercive force results from a decrease in magnetic anisotropy energy.

Figure 15A:
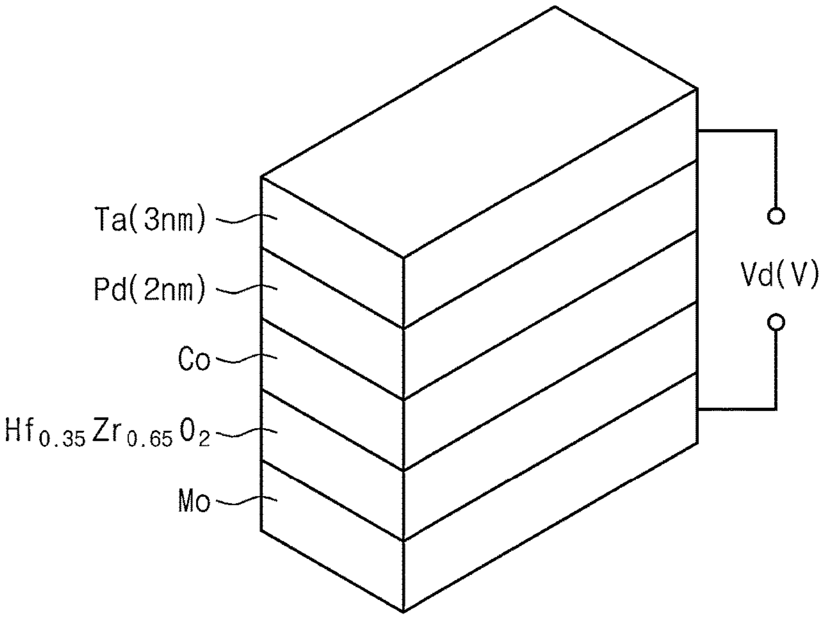
FIG. 15A is a diagram illustrating a sample structure of an antiferroelectric material ($[Hf_{0.35}Zr_{0.65}]O_2$).

FIG. 15A is a diagram illustrating a sample structure with an antiferroelectric material ($[Hf_{0.35}Zr_{0.65}]O_2$).

Figure 15B:
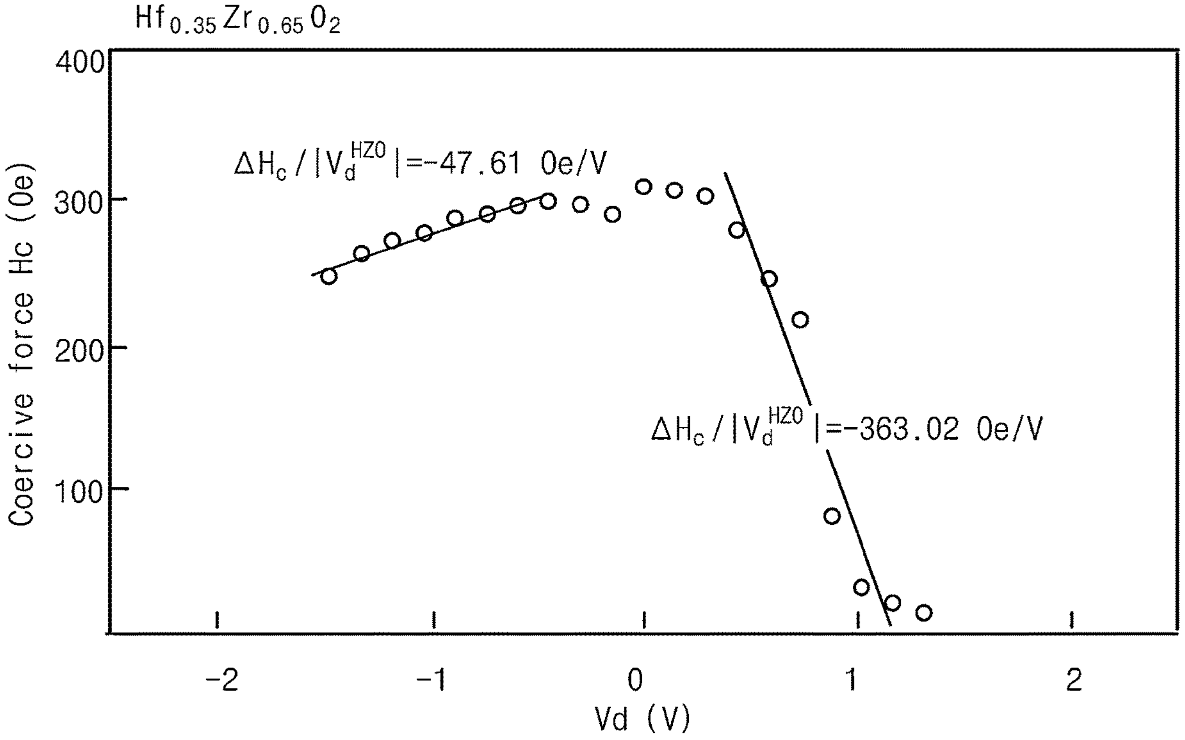
FIG. 15B is a diagram illustrating an experimental result obtained by measuring and analyzing a decrease in coercive force depending on an applied voltage Vd applied to the sample of FIG. 15A using a MOKE.

FIG. 15B is a diagram illustrating an experimental result obtained by measuring and analyzing a decrease in coercive force depending on an applied voltage Vd applied to the sample of FIG. 15A using MOKE magnetometry.

Referring to FIGS. 15A and 15B, a sample has a structure in which a lower conductive layer, an antiferroelectric layer, a ferromagnetic layer, a first upper conductive layer, and a second upper conductive layer ($Mo/Hf_{0.35}Zr_{0.65}O_2/Co/Pd/Ta$) are sequentially stacked. Coercive force Hc exhibits an asymmetrical characteristic depending on a sign of an applied voltage Vd. The coercive force may have a value of 13.1 Oe at an applied voltage Vd of about 1.34 V, and a value of 304.4 Oe at an applied voltage Vd of about 0 V. A slope of the coercive force depending on a positive applied voltage Vd may be −363.92 Oe/V, and a slope of the coercive force depending on a negative applied voltage Vd may be +47.61 Oe/V. A value of the coercive force Hc may be in proportion to the magnetic anisotropy energy of the ferromagnetic layer.

It can be seen that the magnetization reversal is easily occurred because the coercive force is rapidly decreased as a magnitude of the applied voltage is increased. Since the material of the ferromagnetic layer is not changed, it can be seen that a decrease in coercive force results from a decrease in magnetic anisotropy energy.

By comparing FIGS. 14B and 15B, it can be seen that a decrease in coercive force depending on a voltage is significantly larger when $Hf_{0.35}Zr_{0.65}O_2$, the antiferroelectric material, is used than when $HfO_2$, a high-κ dielectric material, is used. This means that, when a voltage is applied, the coercive force of the ferromagnetic material is reduced more when $Hf_{0.35}Zr_{0.65}O_2$ is used, which refers to a significant decrease in magnetic anisotropy energy, than when $HfO_2$ is used. Accordingly, when $Hf_{0.35}Zr_{0.65}O_2$ is used under the condition in which a voltage is applied, magnetization reversal of the ferromagnetic material may be occurred significantly easily. On the other hand, the magnetization reversal of the ferromagnetic material is occurred at a significantly lower applied voltage, so that write power may be significantly reduced to implement a low-power spin logic device.

Figure 16A:
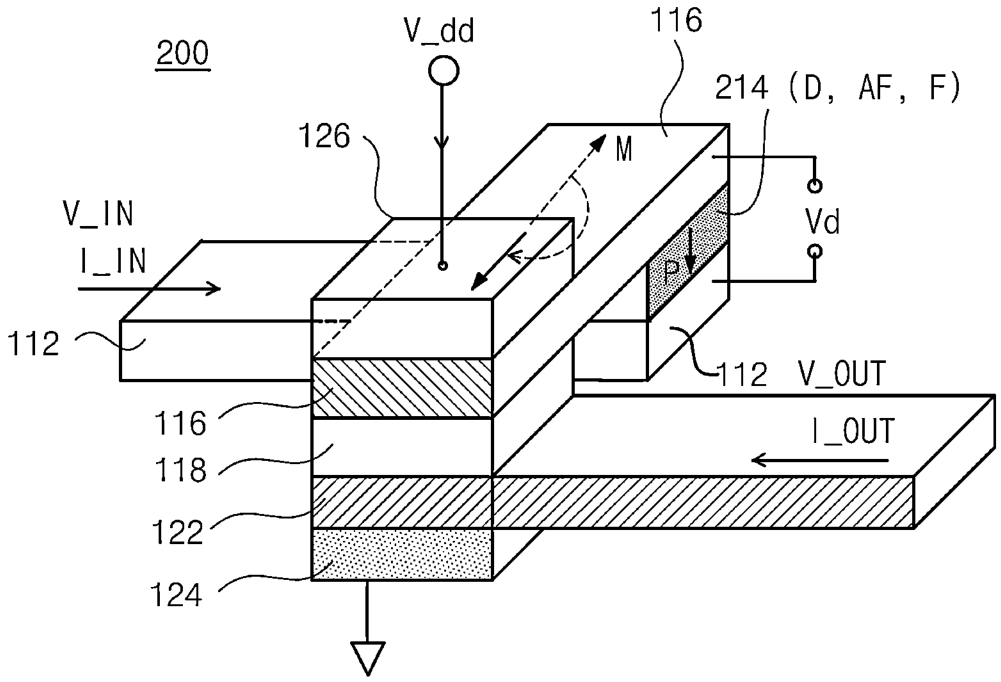
FIG. 16A is a conceptual diagram illustrating a spin logic device according to an example embodiment of the present disclosure.

FIG. 16A is a conceptual diagram illustrating a spin logic device according to an example embodiment of the present disclosure.

Figure 16B:
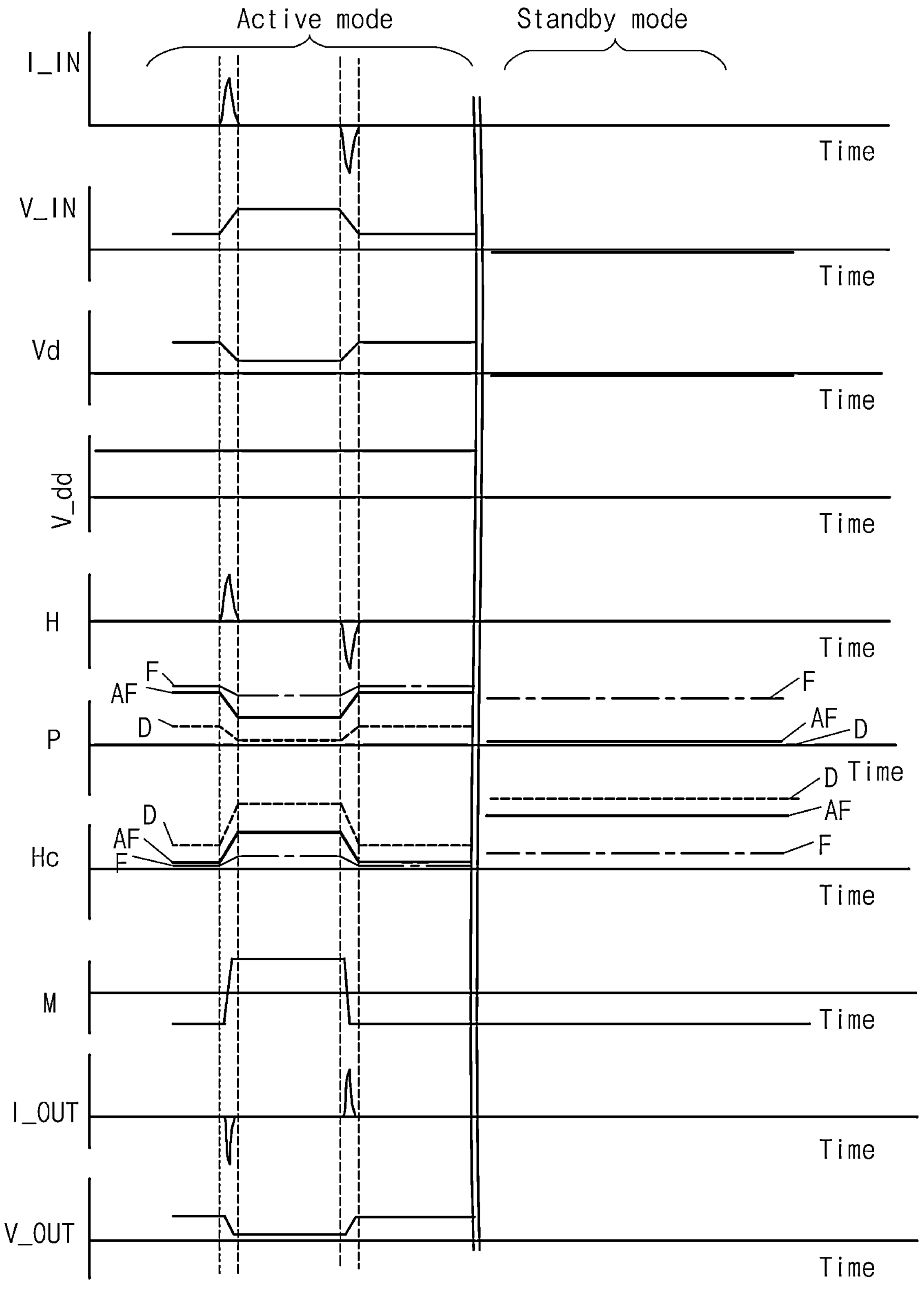
FIG. 16B is a timing diagram according to characteristics of a dielectric layer of the spin logic device of FIG. 16A.

FIG. 16B is a timing diagram according to characteristics of a dielectric layer of the spin logic device of FIG. 16A.

Referring to FIGS. 16A and 16B, a dielectric layer 214 may be a high-κ dielectric layer D, an antiferroelectric layer AF, or a ferroelectric layer F. In the spin logic device 200, it is assumed that first current I_IN flowing in a first conductive layer 112 is applied in the form of a spike.

A first voltage V_IN, applied to the first conductive layer 112, may have a predetermined value provided by a CMOS logic device, a spin logic device, or an appropriate circuit. As an example, the first voltage V_IN may be 0.1 V before the spike current, and a first voltage V_IN (input) may be 0.2 V after the spike current.

An applied voltage Vd is a potential difference between opposite ends of the dielectric layer 214. A bias voltage or a supply voltage V_dd may have a predetermined value (for example, 0.3 V) in an active mode, and may be grounded in a standby mode. In the active mode, a ferromagnetic layer 116 may perform a switching operation. In the standby mode, the ferromagnetic layer 116 may be maintained in a predetermined magnetization direction.

The applied voltage Vd may be a value obtained by subtracting the first voltage V_IN from the supply voltage V_dd. In the active mode, the applied voltage Vd may cause polarization P of the dielectric layer 214. In the standby mode, the applied voltage Vd may become zero and polarization P of the dielectric layer 214 may be changed depending on the high-κ dielectric layer D, the antiferroelectric layer AF, or the ferroelectric layer F.

The first current I_IN, flowing in the first conductive layer 112, may generate a magnetic field H around the first conductive layer 112 based on Ampere's law. A direction of the magnetic field H may determine a magnetization direction of the ferromagnetic layer 116. Due to the spike-like first current I_IN, the magnetic field H may be formed for only a time corresponding to a pulse duration of the first current I_IN.

The applied voltage Vd may determine polarization P of the dielectric layer 214. When the applied voltage Vd is high, a magnitude of polarization may be large.

Strength of a magnetic field for magnetization reversal of the ferromagnetic layer 116 may correspond to coercive force Hc. The coercive force Hc may be in proportion to magnetic anisotropy energy of the ferromagnetic layer 116. The coercive force Hc may be in inverse relation to the polarization P of the dielectric layer 214. As an example, a reduction in coercive force Hc may be greater when the polarization P of the dielectric layer 214 than when the polarization P of the dielectric layer 214 is small, so that strength of the coercive force Hc for magnetization reversal may be significantly reduced.

When the high-κ dielectric layer D and the antiferroelectric layer AF are compared with each other in the active mode, the antiferroelectric layer AF may have a higher polarization than the high-κ dielectric layer D with respect to a predetermined applied voltage Vd. Accordingly, the coercive force Hc of the ferromagnetic layer 116 adjacent to the antiferroelectric layer AF may become smaller than the coercive force Hc of the ferromagnetic layer 116 adjacent to the high dielectric layer D with respect to a predetermined applied voltage Vd. Accordingly, magnetization reversal of the ferromagnetic layer 116 adjacent to the antiferroelectric layer AF may be easily occurred due to the significantly reduced coercive force Hc.

When the ferroelectric layer F and the antiferroelectric layer AF are compared with each other in the active mode, the antiferroelectric layer AF may have polarization, similar to polarization of the ferroelectric layer F with respect to an applied voltage Vd. Accordingly, coercive force Hc of the ferromagnetic layer 116 adjacent to the antiferroelectric layer AF may have a value, similar to a value of coercive force Hc of the ferromagnetic layer 116 adjacent to the ferroelectric layer F with respect to the applied voltage Vd.

When the high dielectric layer D and the antiferroelectric layer AF are compared with each other in the standby mode, the antiferroelectric layer AF may have zero polarization at an applied voltage Vd of 0 V. Accordingly, the coercive force Hc of the ferromagnetic layer 116 adjacent to the antiferroelectric layer AF may be a large value, similar to a value of the coercive force Hc of the ferromagnetic layer 116 adjacent to the high dielectric layer D with respect to the applied voltage Vd of 0 V. As a result, magnetization reversal of the ferromagnetic layer 116 adjacent to the antiferroelectric layer AF may not be easily occurred due to the large coercive force Hc.

When the ferroelectric layer F and the antiferroelectric layer AF are compared with each other in the standby mode, the antiferroelectric layer AF may have zero polarization at an applied voltage Vd of 0 V. Accordingly, the coercive force Hc of the ferromagnetic layer 116 adjacent to the antiferroelectric layer AF may have a value, greater than a value of the coercive force Hc of the ferromagnetic layer 116 adjacent to the ferroelectric layer F with respect to the applied voltage Vd of 0 V. As a result, magnetization reversal of the ferromagnetic layer 116 adjacent to the antiferroelectric layer AF may not be easily occurred due to the large coercive force Hc.

For example, in the active mode, when the dielectric layer 214 is an antiferroelectric material AF, magnetization reversal of the dielectric layer 214 may be easily occurred by a magnetic field, generated by the first current, due to the small coercive force Hc. On the other hand, in the standby mode, when the dielectric layer 214 is an antiferromagnetic material AF, the magnetization reversal of the dielectric layer 214 may not be easily occurred by a magnetic field, generated by external noise current, due to the large coercive force Hc.

When the supply voltage V_dd is applied through the upper auxiliary electrode 126, spin current generated according to the magnetization direction of the ferromagnetic layer 116 may be injected into the spin-charge conversion layer 118. Spin-to-charge conversion may occur through the spin-to-charge conversion layer 118. Accordingly, the second current I_OUT may be induced in the second conductive layer 122. The second current I_OUT may be spike-like current. A direction of the first current I_IN may be opposite to a direction of the second current I_OUT. The second voltage V_OUT of the second conductive layer 122 may have a predetermined value due to the supply voltage V_dd through the auxiliary upper electrode 126. Also, the second voltage V_OUT may depend on the magnetization direction of the ferromagnetic layer 116.

Figure 17:
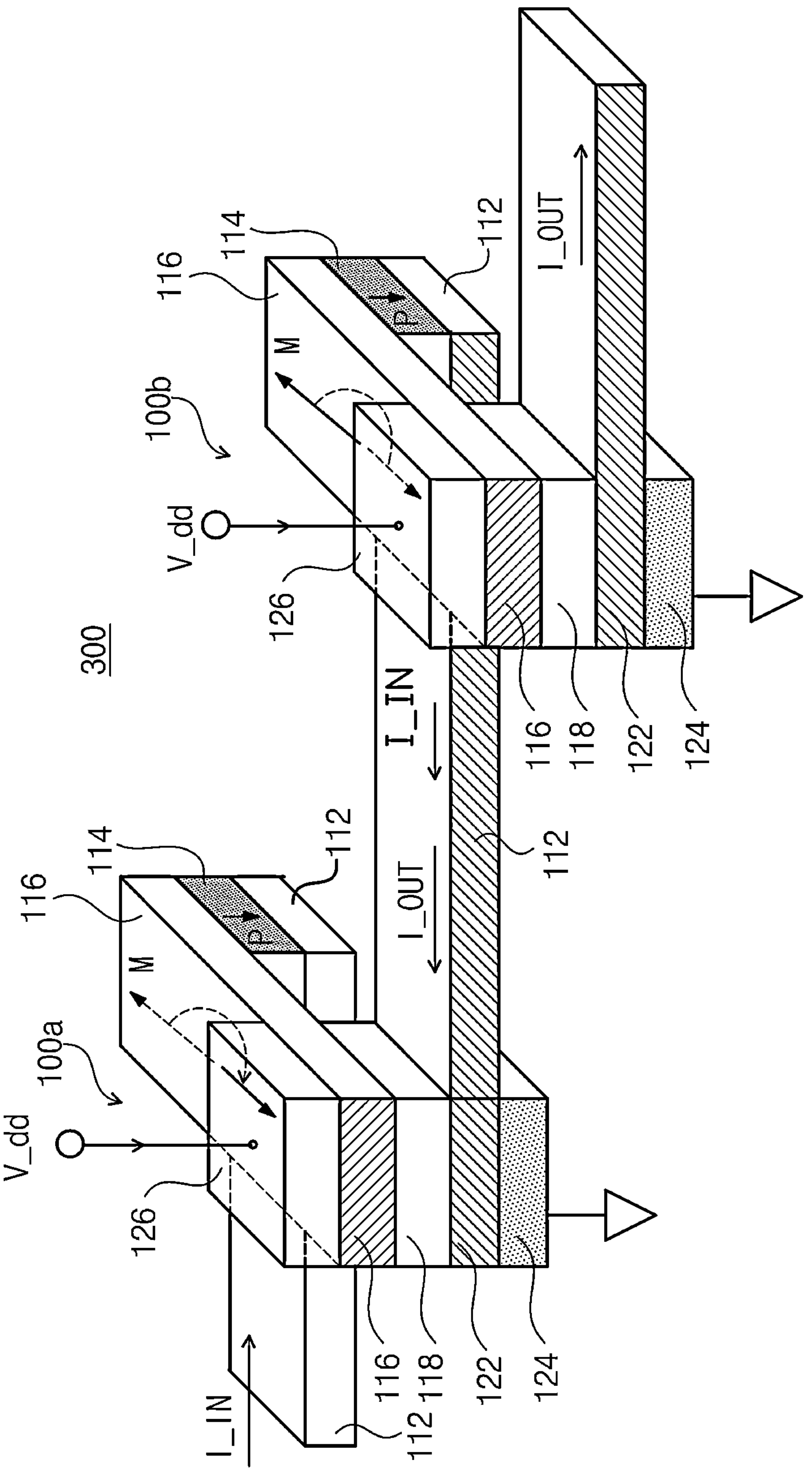
FIG. 17 is a conceptual diagram illustrating a spin logic device according to another example embodiment of the present disclosure.

FIG. 17 is a conceptual diagram illustrating a spin logic device according to another example embodiment of the present disclosure.

Referring to FIG. 17, a spin logic device 300 may include a first spin logic device 100*a* and a second spin logic device 100*b*. The spin logic device 200 may operate as a buffer.

Each of the spin logic devices 100*a* and 100*b* may include a first conductive layer 112 formed of a nonmagnetic conductive material and having one end receiving first current I_IN as an input, a ferromagnetic layer 116 having magnetic anisotropy and having one end opposing the other end of the first conductive layer 112, and an antiferroelectric layer 114 disposed between the other end of the first conductive layer 112 and the one end of the ferromagnetic layer 116. A magnetization direction of the ferromagnetic layer 116 may be determined based on a current direction of first current I_IN of the first conductive layer 112.

The second conductive layer 122 may be formed of a nonmagnetic conductive material and may be disposed to be spaced apart from the first conductive layer 112 and to be vertically spaced apart from the other end of the ferromagnetic layer 116. The spin-to-charge conversion layer 118 may be disposed between the other end of the ferromagnetic layer 116 and one end of the second conductive layer 122.

A spin injection layer (not illustrated) may be disposed between the spin-charge conversion layer 118 and the ferromagnetic layer 116. The spin injection layer may be a tunnel insulating layer such as magnesium oxide (MgO).

A lower auxiliary electrode 124 may be electrically connected to ground, and may be disposed below the one end of the second conductive layer 122. An upper auxiliary electrode 126 may be disposed above the other end of the ferromagnetic layer 116. A V_dd power supply may operate in the form of a pulse, and may be connected to the upper auxiliary electrode 126. A direction of the second current I_OUT, flowing in the other end of the second conductive layer 122, may be determined based on the magnetization direction of the ferromagnetic layer 116.

The second conductive layer 122 of the first spin logic device 100*a* may be the first conductive layer 112 of the second spin logic device 100*b*.

Figure 18:
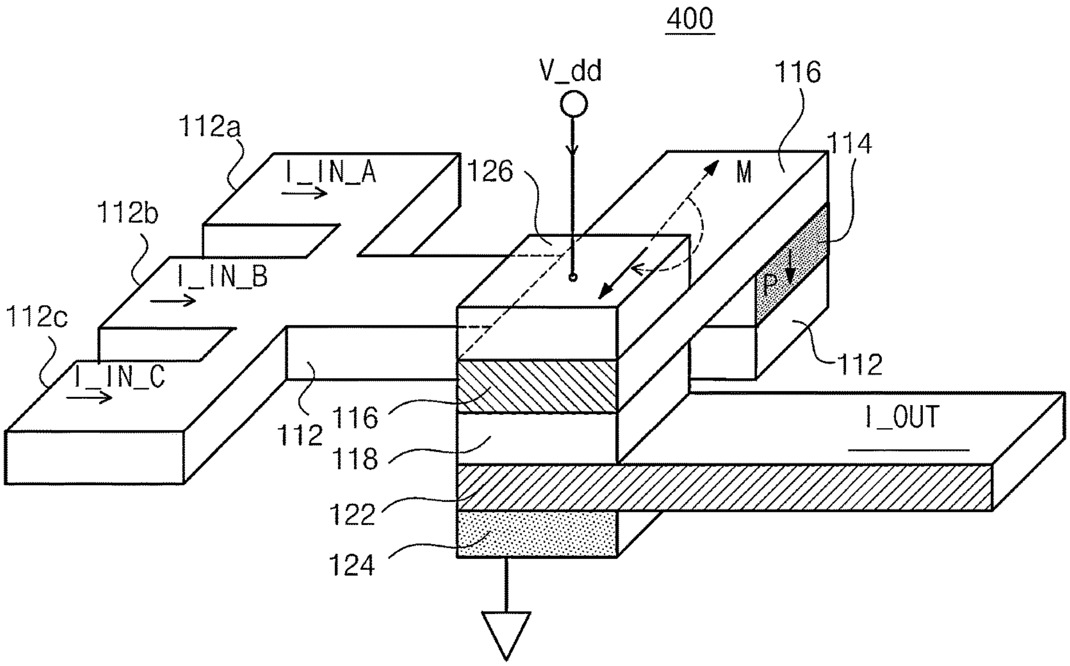
FIG. 18 is a conceptual diagram illustrating a spin logic device according to another example embodiment of the present disclosure.

FIG. 18 is a conceptual diagram illustrating a spin logic device according to another example embodiment of the present disclosure.

Referring to FIG. 18, a spin logic device 400 may include a first conductive layer 112 formed of a nonmagnetic conductive material and having one end receiving first current I_IN as an input, a ferromagnetic layer 116 having magnetic anisotropy and having one end opposing the other end of the first conductive layer 112, and an antiferroelectric layer 114 disposed between the other end of the first conductive layer 112 and the one end of the ferromagnetic layer 116. A magnetization direction of the ferromagnetic layer 116 is determined according to a current direction of the first current I_IN of the first conductive layer 112.

A second conductive layer 122 may be formed of a nonmagnetic conductive layer, and may be disposed to be spaced apart from the first conductive layer 112 and to be vertically spaced apart from the other end of the ferromagnetic layer 116. A spin-to-charge conversion layer 118 may be disposed between the other end of the ferromagnetic layer 116 and one end of the second conductive layer 122.

A lower auxiliary electrode 124 may be electrically connected to ground, and may be disposed below the one end of the second conductive layer 122. An upper auxiliary electrode 126 may be disposed above the other end of the ferromagnetic layer 116. A V_dd power supply may operate in the form of a pulse, and may be connected to the upper auxiliary electrode 126. A direction of the second current I_OUT, flowing in the other end of the second conductive layer 122, may be determined based on a magnetization direction of the ferromagnetic layer 116.

The one end of the first conductive layer 112 may include a plurality of branched input terminals 112*a*, 112*b*, and 112*c*. Input currents I_IN_A, I_IN_B, and I_IN_C may be provided through the input terminals 112*a*, 112*b*, and 112*c*, respectively. Magnitudes of the input currents I_IN_A, I_IN_B, and I_IN_C may be the same, and directions thereof may be the same or different from each other. The direction of the first current may be determined by a majority vote of the input currents I_IN_A, I_IN_B, and I_IN_C.

Figure 19:
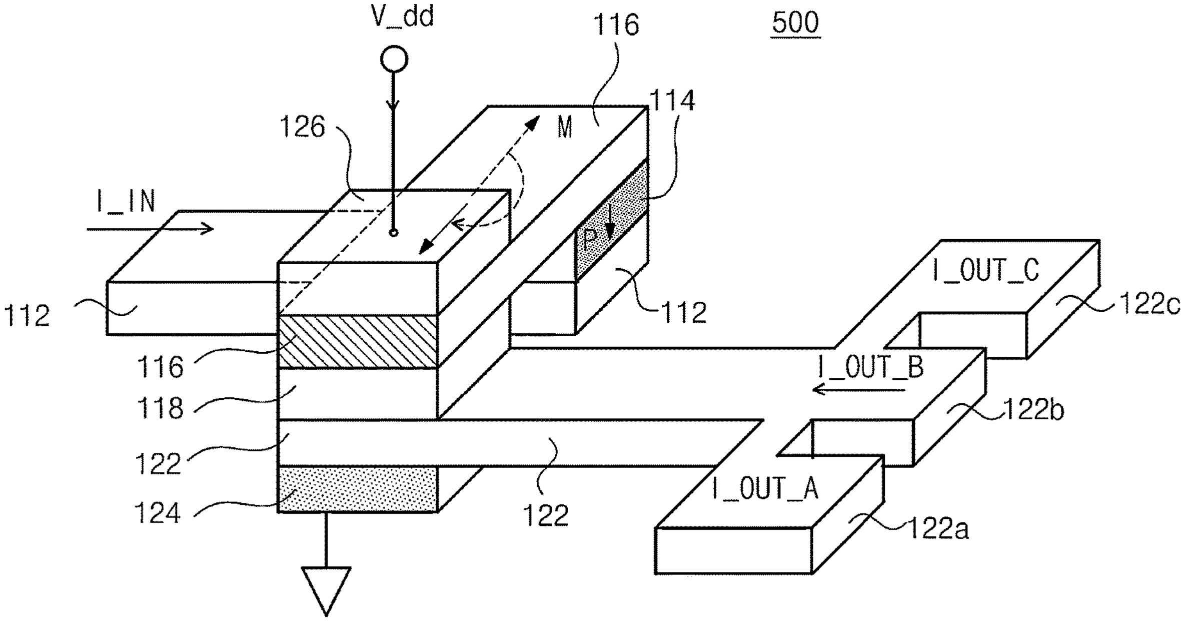
FIG. 19 is a conceptual diagram illustrating a spin logic device according to another example embodiment of the present disclosure.

FIG. 19 is a conceptual diagram illustrating a spin logic device according to another example embodiment of the present disclosure.

Referring to FIG. 19, a spin logic device 500 may include a first conductive layer 112 formed of a nonmagnetic conductive material and having one end receiving first current I_IN as an input, a ferromagnetic layer 116 having magnetic anisotropy and having one end opposing the other end of the first conductive layer 112, and an antiferroelectric layer 114 disposed between the other end of the first conductive layer 112 and one end of the ferromagnetic layer 116. A magnetization direction of the ferromagnetic layer 116 may be determined based on a current direction of the first current I_IN of the first conductive layer 112.

A second conductive layer 122 may be formed of a nonmagnetic conductive material, and may be disposed to be spaced apart from the first conductive layer 112 and to be vertically spaced apart from the other end of the ferromagnetic layer 116. A spin-to-charge conversion layer 118 may be disposed between the other end of the ferromagnetic layer 116 and the one end of the second conductive layer 122.

A lower auxiliary electrode 124 may be electrically connected to ground, and may be disposed below the one end of the second conductive layer 122. An upper auxiliary electrode 126 may be disposed above the other end of the ferromagnetic layer 116. A V_dd power supply may operate in the form of a pulse, and may be connected to the upper auxiliary electrode 126. A direction of the second current I_OUT, flowing in the other end of the second conductive layer 122, may be determined based on a magnetization direction of the ferromagnetic layer 116.

The other end of the second conductive layer 122 may include a plurality of branched output terminals 122*a*, 122*b*, and 122*c*. Output currents I_OUT_A, I_OUT_B, and I_OUT_C may be provided through the output terminals 122*a*, 122*b*, and 122*c*, respectively. The output currents I_OUT_A, I_OUT_B, and I_OUT_C may have the same magnitude, and may have the same direction.

Figure 20:
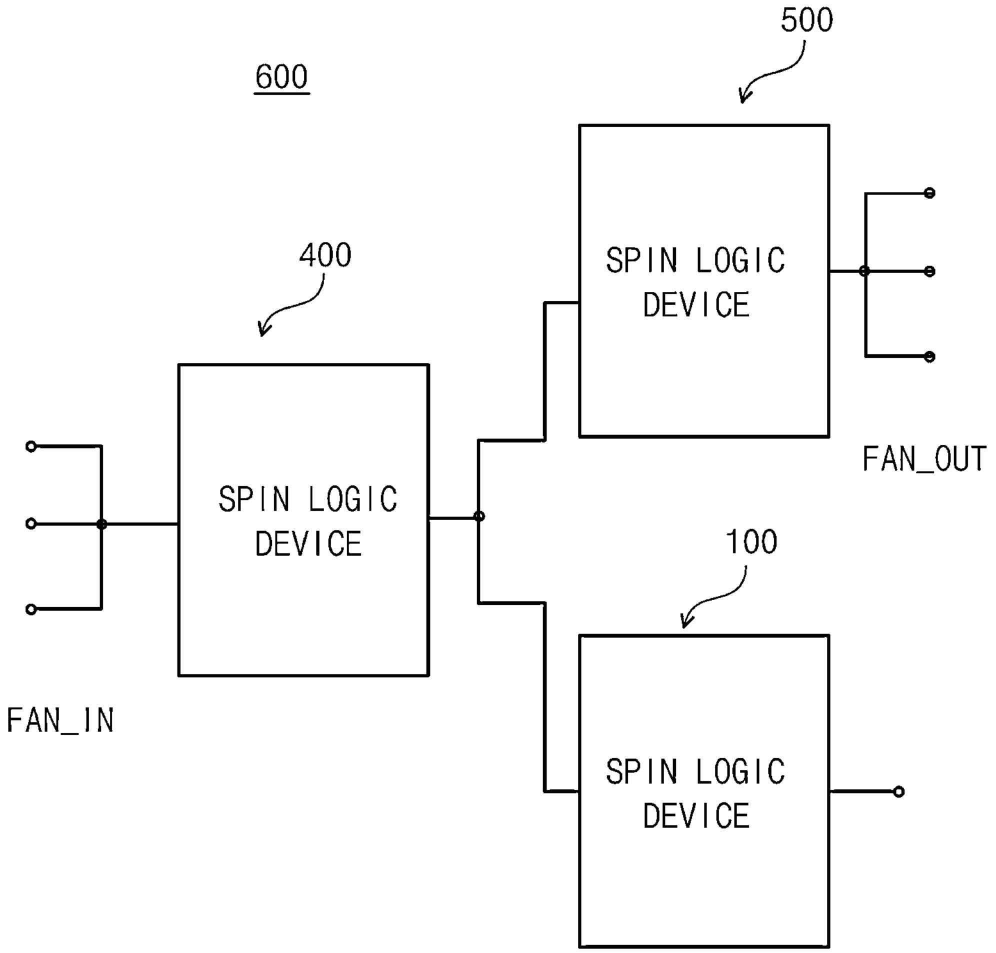
FIG. 20 is a conceptual diagram illustrating a spin logic device according to another example embodiment of the present disclosure.

FIG. 20 is a conceptual diagram illustrating a spin logic device according to another example embodiment of the present disclosure.

Referring to FIG. 20, a spin logic device 600 may include a fan-in (FAN_IN) spin logic device 400 having a plurality of input terminals, a fan-out (FAN_OUT) spin logic device 500 having a plurality of outputs, and a spin logic device 100 having a single input and a single output. The spin logic device 600 may perform various logic operations.

As set forth above, a spin logic device according to an example embodiment may provide higher magnetic anisotropy energy or a more improved coercive reduction effect (coercive reduction amount/unit voltage) when a ferromagnetic material is used than when a high-κ dielectric material having a high dielectric constant is used.

A spin logic device according to an example embodiment may provide low switching energy, a low applied voltage Vd, improved data retention, and nonvolatile characteristics.

A spin logic device according to an example embodiment may implement a stable operation with low power, and may provide high-speed data processing, and low power consumption.

Although the present disclosure and its advantages have been described in detail, it should be understood that various changes, substitutions and alterations can be made herein without departing from the spirit and scope of the disclosure as defined by the following claims.

What is claimed is:

1. A spin logic device comprising:

a first conductive layer formed of a nonmagnetic conductive material and having one end receiving a first current as an input;

a ferromagnetic layer having magnetic anisotropy and having one end opposing another end of the first conductive layer; and an antiferroelectric layer between the other end of the first conductive layer and the one end of the ferromagnetic layer, wherein a magnetization direction of the ferromagnetic layer is determined based on a current direction of the first current of the first conductive layer, in an active mode where the first current is applied, the ferromagnetic layer reverses magnetization by a first magnetic field of the first current due to a first coercive force, and in a standby mode where the first current is not applied, the ferromagnetic layer does not undergo magnetization reversal by a second magnetic field due to an external noise current due to a second coercive force, in the standby mode in which the first current is absent, the second magnetic field induced by the external noise current does not exceed the second coercive force of the ferromagnetic layer without an application of a first voltage between the first conductive layer and the ferromagnetic layer, such that the ferromagnetic layer does not undergo the magnetization reversal, and in the active mode where the first current is applied, the first magnetic field generated by the first current exceeds the first coercive force of the ferromagnetic layer reduced by application of a second voltage between the first conductive layer and the ferromagnetic layer, and thereby causes magnetization reversal of the ferromagnetic layer.

2. The spin logic device as set forth in claim 1, comprising:

a second conductive layer comprising another nonmagnetic conductive material, spaced apart from the first conductive layer and vertically spaced apart from another end of the ferromagnetic layer;

a spin-to-charge conversion layer between the other end of the ferromagnetic layer and one end of the second conductive layer;

a lower auxiliary electrode electrically connected to ground or a negative voltage and below the one end of the second conductive layer; and an upper auxiliary electrode above the other end of the ferromagnetic layer, wherein the upper auxiliary electrode is connected to a supply voltage, and a direction of a second current, flowing in another end of the second conductive layer, is determined based on the magnetization direction of the ferromagnetic layer.

3. The spin logic device as set forth in claim 2, wherein the one end of the first conductive layer comprises a plurality of branched input terminals, and a plurality of input currents are provided through the input terminals, respectively.

4. The spin logic device as set forth in claim 2, wherein the other end of the second conductive layer comprises a plurality of branched output terminals, and output currents are provided through the output terminals, respectively.

5. The spin logic device as set forth in claim 2, further comprising:

a second spin logic device identical to the spin logic device, wherein the second conductive layer of the first spin logic device is the first conductive layer of the second spin logic device.

6. The spin logic device as set forth in claim 1, wherein the antiferroelectric layer includes $Hf_xZr_{1-x}O_2$, where x ranges from 0.1 to 0.4.

7. The spin logic device as set forth in claim 6, wherein x ranges from 0.12 to 0.32.

8. The spin logic device as set forth in claim 6, wherein the antiferroelectric layer has a thickness of 3 nm to 29 nm.

9. The spin logic device as set forth in claim 1, wherein the antiferroelectric layer has a voltage-dependent current hysteresis loop with a single peak in each of first, second, third, and fourth quadrants of the voltage-dependent current hysteresis loop.

10. The spin logic device as set forth in claim 1, wherein the coercive force of the ferromagnetic layer exhibits an asymmetrical characteristic depending on a sign of an applied voltage between the first conductive layer and the antiferroelectric layer, a sign of a slope of the coercive force depending on a positive applied voltage between the first conductive layer and the antiferroelectric layer is negative, a sign of a slope of the coercive force depending on a negative applied voltage between the first conductive layer and the antiferroelectric layer is positive, and a magnitude of the slope of the coercive force depending on the positive applied voltage is different from a magnitude of the slope of the coercive force depending on the negative applied voltage.

11. The spin logic device as set forth in claim 1, wherein the second coercive force is greater than the first coercive force.

12. A spin logic device, comprising:

a first conductive layer formed of a nonmagnetic conductive material and having one end receiving a first current as an input;

a ferromagnetic layer having magnetic anisotropy and having one end opposing another end of the first conductive layer; and an antiferroelectric layer between the other end of the first conductive layer and the one end of the ferromagnetic layer, wherein a magnetization direction of the ferromagnetic layer is determined based on a current direction of the first current of the first conductive layer, the antiferroelectric layer has a voltage-dependent current hysteresis loop with a first peak in a first quadrant, and a second peak in the first quadrant and a second quadrant, and the voltage-dependent current hysteresis loop has a third peak in a third quadrant, and a fourth peak at a boundary between the third quadrant and a fourth quadrant of the voltage-dependent current hysteresis loop.

13. A spin logic device, comprising:

a first conductive layer formed of a nonmagnetic conductive material and having one end receiving a first current as an input;

a ferromagnetic layer having magnetic anisotropy and having one end opposing another end of the first conductive layer; and an antiferroelectric layer between the other end of the first conductive layer and the one end of the ferromagnetic layer, wherein a magnetization direction of the ferromagnetic layer is determined based on a current direction of the first current of the first conductive layer, and a slope of a coercive force of the ferromagnetic layer to a potential difference of a potential of the ferromagnetic layer to a potential of the first conductive layer is −363 Oe/V or negatively more.

* * * * *